(12) United States Patent
Rasmussen et al.

(10) Patent No.: US 7,888,452 B2
(45) Date of Patent: Feb. 15, 2011

(54) LOW BAND GAP SEMICONDUCTING POLYMERS

(75) Inventors: Seth C. Rasmussen, Fargo, ND (US); Jon P. Nietfeld, Fargo, ND (US)

(73) Assignee: NDSU Research Foundation, Fargo, ND (US)

( * ) Notice: Subject to any disclaimer, the term of this patent is extended or adjusted under 35 U.S.C. 154(b) by 285 days.

(21) Appl. No.: 12/197,848

(22) Filed: Aug. 25, 2008

(65) Prior Publication Data

US 2009/0065059 A1 Mar. 12, 2009

Related U.S. Application Data

(60) Provisional application No. 60/957,961, filed on Aug. 24, 2007.

(51) Int. Cl.
C08G 75/00 (2006.01)
(52) U.S. Cl. ............... 528/377; 528/380; 528/373; 136/263; 257/40; 438/99
(58) Field of Classification Search .......... 528/377, 528/373, 380; 136/263; 257/40; 438/99
See application file for complete search history.

(56) References Cited

U.S. PATENT DOCUMENTS

| | | | | |
|---|---|---|---|---|
| 4,808,336 | A * | 2/1989 | Rubner et al. | 252/500 |
| 5,510,438 | A | 4/1996 | Ferraris et al. | |
| 6,242,561 | B1 | 6/2001 | Mohwald et al. | |
| 2002/0084504 | A1 * | 7/2002 | Narayan | 257/462 |

OTHER PUBLICATIONS

Huang, "Tunable Dipolar Acenaphthopyrazine Derivatives Containing Diphenylamine", *Chem. Mater.*, 16, 5387-5393, 2004.
Janietz, "Electrochemical determination of the ionization potential and electron affinity of poly(9,9)-dioctylfluorene," *Appl. Phys. Lett.*, 73, 2453-2455, 1998.
Kenning, "Thieno[3, 4-*b*]pyrazines; Synthesis, Structure, and Reactivity", *J. Org. Chem.*, 67, 9073-9076, 2002.
Kenning, "A Second Look at Polythieno[3, 4-*b*]pyrazines: Chemical vs. Electrochemical Polymerization and Its Effect on Band Gap", *Macromolecules*, 36, 6298-6299, 2003.
Kinbara, "Electronic structures of poly(3-arylthiophene) films and their interfaces with metals in Air", *Synth. Met.*, 114, 295-303, 2000.
Larson, "Reference Electrodes for Voltammetry in Acetonitrile", *Anal. Chim. Acta.*, 25, 371-374, 1961.
Mallory, "Nuclear Spin-Spin Coupling via Nonbonded Interactions. 8. The Distance Dependence of Through-Space Fluorine-Fluorine Coupling", *J. Am. Chem. Soc.*, 122(17), 4108-4116, 2000.

(Continued)

*Primary Examiner*—Randy Gulakowski
*Assistant Examiner*—Shane Fang
(74) *Attorney, Agent, or Firm*—Viksnins Harris & Padys PLLP

(57) ABSTRACT

The invention provides a polymer of formula I:

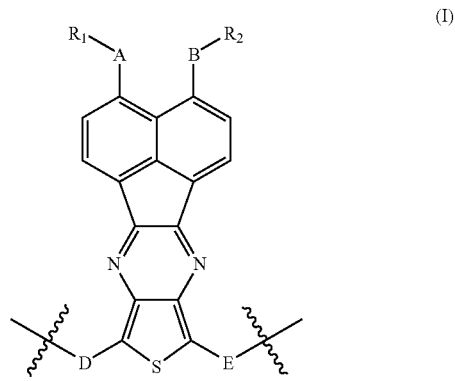

wherein A, B, D, E, $R_1$, and $R_2$ have any of the values defined in the specification, as well as electrical devices comprising such polymers.

27 Claims, 10 Drawing Sheets

OTHER PUBLICATIONS

Miyaki, "Novel Acenaphthylthienopyrazine Based Low Band-gap Polymers for Solar Cell Applications", *Polymeric Materials: Science and Engineering*, 99, 266-267, 2008.

Petersen, "Low band gap poly-thienopyrazines for solar cells-Introducing the 11-thia-9,13-diaza-cyclopenta[*b*]triphenylenes", *Solar Energy Materials & Solar Cells*, 91, 996-1009, 2007.

Rasmussen, "Low Bandgap Conducting Polymers", *Handbook of Conducting Polymers*, vol. 1.Chapter 12, 421-462, 2007.

Roncali, "Conjugated poly(thiophenes): Synthesis, Functionalization, and Applications", *Chem. Rev.*, 92, 711-738, 1992.

Roncali, "Synthetic Principles for Bandgap Control in Linear π-Conjugated Systems", *Chem. Rev.*, 97, 173-205, 1997.

Surek. "Crystal growth and materials research in photovoltaics: progress and challenges", *Journal of Crystal Growth*, 275, 292-304, 2005.

Wen, "Synthesis and structural characterization of 2,5-dihalo-3,4-dinitrothiophenes", *J. Chem. Crystallography*, 37, 387, 2007.

* cited by examiner

LOW BAND GAP SEMICONDUCTING POLYMERS

PRIORITY OF INVENTION

This application claims priority from U.S. Provisional Application No. 60/957,961, filed 24 Aug. 2007.

GOVERNMENT FUNDING

The invention described herein was made with government support under Grant Number CHE-0132886 awarded by the National Science Foundation. The United States Government has certain rights in the invention.

BACKGROUND OF THE INVENTION

Conjugated polymers continue to attract significant attention due to their desirable optical and electronic properties, which has led to their application in light emitting-diodes (LEDs), photovoltaic devices, sensors, electrochromic devices, and field effect transistors (FET). See (a) *Semiconducting Polymers: Chemistry, Physics and Engineering*; G. Hadziioannou and P. F. van Hutten, Eds.; Wiley-VCH: Weinheim, 2000; (b) *Handbook of Oligo-and Polythiophenes*, D. Fichou, Ed.; Wiley-VCH: Weinheim, 1999; and (c) J. Roncali, *Chem. Rev.* 1992, 92, 711.

The advantage of utilizing conjugated polymers in such applications is the ability to tune the properties of such materials at the molecular level. In particular, many of the properties of interest are dependent on the energetic width of the material's band gap ($E_g$), which is the energy between the filled valence and empty conduction bands and thus corresponds to the HOMO-LUMO gap of the solid state material. The $E_g$ therefore determines both the lowest energy absorbance of the material and the energy of any potential emission. Low $E_g$ values result in enhanced thermal population of the conduction band and increase the number of intrinsic charge carriers. In addition, the lower oxidation potential associated with low $E_g$ values results in a stabilization of the corresponding doped (i.e., oxidized) state. See (a) J. Roncali, *Chem. Rev.* 1997, 97, 173; and (b) S. C. Rasmussen and M. Pomerantz, In the *Handbook of Conducting Polymers*, 3rd Ed.; T. A. Skotheim and J. R. Reynolds, Eds.; CRC Press: Boca Raton, Fla., 2007; Vol. 1, Chapter 12. Thus, control of the polymer band gap is an important factor in the production of technologically useful materials.

Currently there is a need for novel organic semi-conducting materials. Such materials will be useful, for example, in electrical devices, such as photovoltaic devices, sensors, display devices, and electrochromic devices, including components of plastic devices.

SUMMARY OF THE INVENTION

Novel organic semiconducting polymers have been prepared that possess low band gaps and/or high stability. Accordingly, in one embodiment the invention provides a polymer of the invention which is a polymer comprising one or more units of formula I:

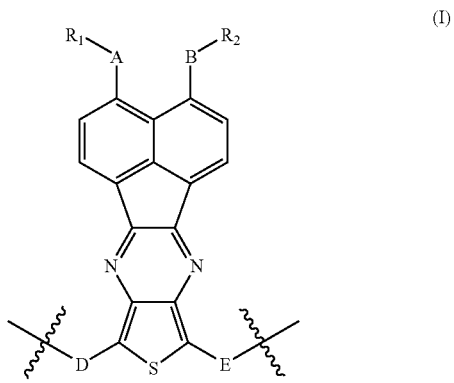

wherein:
A is a bond; and $R_1$ is H, $(C_1-C_{12})$alkyl, $(C_2-C_{12})$alkenyl, $(C_2-C_{12})$alkynyl, $(C_3-C_8)$cycloalkyl, $(C_1-C_{12})$alkanoyl, $(C_1-C_{12})$alkoxycarbonyl, cyano, halo, nitro, $R_eOSO_2$—, carboxy, trifluoromethyl, aryl, aryl$(C_1-C_{12})$alkyl, —$CH_2CH_2O(CH_2CH_2O)_mCH_3$, or $NR_aR_b$; or A is O, S, or Se and $R_1$ is H, $(C_1-C_{12})$alkyl, $(C_2-C_{12})$alkenyl, $(C_2-C_{12})$alkynyl, $(C_3-C_{12})$cycloalkyl, $(C_1-C_{12})$alkanoyl, trifluoromethyl, aryl, or aryl$(C_1-C_{12})$alkyl, or —$CH_2CH_2O(CH_2CH_2O)_mCH_3$; wherein each aryl is optionally substituted with one or more (e.g. 1, 2, 3, or 4) $(C_1-C_{12})$alkyl, $(C_2-C_{12})$alkenyl, $(C_2-C_{12})$alkynyl, $(C_1-C_{12})$alkoxy, $(C_3-C_8)$cycloalkyl, $(C_1-C_{12})$alkanoyl, $(C_1-C_{12})$alkanoyloxy, $(C_1-C_{12})$alkoxycarbonyl, cyano, halo, nitro, carboxy, trifluoromethyl, trifluoromethoxy, or methylenedioxy;

B is a bond; and $R_2$ is H, $(C_1-C_{12})$alkyl, $(C_2-C_{12})$alkenyl, $(C_2-C_{12})$alkynyl, $(C_3-C_8)$cycloalkyl, $(C_1-C_{12})$alkanoyl, cyano, halo, nitro, $R_eOSO_2$—, carboxy, trifluoromethyl, aryl, aryl$(C_1-C_{12})$alkyl, —$CH_2CH_2O(CH_2CH_2O)_mCH_3$, or $NR_cR_d$; or B is O, S, or Se and $R_2$ is H, $(C_1-C_{12})$alkyl, $(C_2-C_{12})$alkenyl, $(C_2-C_{12})$alkynyl, $(C_3-C_8)$cycloalkyl, $(C_1-C_{12})$alkanoyl, trifluoromethyl, aryl, or aryl $(C_1-C_{12})$alkyl, or —$CH_2CH_2O(CH_2CH_2O)_mCH_3$; wherein each aryl is optionally substituted with one or more (e.g. 1, 2, 3, or 4) $(C_1-C_{12})$alkyl, $(C_2-C_{12})$alkenyl, $(C_2-C_{12})$alkynyl, $(C_1-C_{12})$alkoxy, $(C_3-C_8)$cycloalkyl, $(C_1-C_{12})$alkanoyl, $(C_1-C_{12})$alkanoyloxy, $(C_1-C_{12})$alkoxycarbonyl, cyano, halo, nitro, carboxy, trifluoromethyl, trifluoromethoxy, or methylenedioxy;

$R_a$ and $R_b$ are each independently $(C_1-C_{12})$alkyl, $(C_2-C_{12})$alkenyl, $(C_2-C_{12})$alkynyl, $(C_1-C_{12})$alkoxy, $(C_3-C_8)$cycloalkyl, $(C_1-C_{12})$alkanoyl, $(C_1-C_{12})$alkanoyloxy, aryl, aryl$(C_1-C_{12})$alkyl, —$CH_2CH_2O(CH_2CH_2O)_mCH_3$, or $(C_1-C_{12})$alkoxycarbonyl; or $R_a$ and $R_b$ together with the nitrogen to which they are attached form a morpholino, thiomorpholino or pyrrolidino ring;

$R_c$ and $R_d$ are each independently $(C_1-C_{12})$alkyl, $(C_2-C_{12})$alkenyl, $(C_2-C_{12})$alkynyl, $(C_1-C_{12})$alkoxy, $(C_3-C_8)$cycloalkyl, $(C_1-C_{12})$alkanoyl, $(C_1-C_{12})$alkanoyloxy, aryl, aryl$(C_1-C_{12})$alkyl, —$CH_2CH_2O(CH_2CH_2O)_mCH_3$, or $(C_1-C_{12})$alkoxycarbonyl; or $R_c$ and $R_d$ together with the nitrogen to which they are attached form a morpholino, thiomorpholino or pyrrolidino ring;

$R_e$ is H or $(C_1-C_{12})$alkyl;

m is 0-5;

D is absent or is phenyl, thienyl, bithienyl, terthienyl, quaterthienyl, or fluorenyl, which phenyl, thienyl, bithienyl, terthienyl, quaterthienyl, and fluorenyl is optionally substituted with one or more (e.g. 1, 2, 3, or 4) $(C_1-C_{12})$alkyl, $(C_2-C_{12})$alkenyl, $(C_2-C_{12})$alkynyl, $(C_1-C_{12})$alkoxy, $(C_3-C_8)$cycloalkyl, $(C_1-C_{12})$alkanoyl, $(C_1-C_{12})$alkanoyloxy, $(C_1-C_{12})$alkoxycarbonyl, cyano, halo, nitro, carboxy, trifluoromethyl, trifluoromethoxy, or methylenedioxy; and E is absent or is phenyl, thienyl, bithienyl, terthienyl, quaterthienyl, or fluorenyl, which phenyl, thienyl, bithienyl, terthienyl, quaterthienyl, and fluorenyl is optionally substituted with one or more (e.g. 1, 2, 3, or 4) $(C_1-C_{12})$alkyl, $(C_2-C_{12})$alkenyl, $(C_2-C_{12})$alkynyl, $(C_1-C_{12})$alkoxy, $(C_3-C_8)$cycloalkyl, $(C_1-C_{12})$alkanoyl, $(C_1-C_{12})$alkanoyloxy, $(C_1-C_{12})$alkoxycarbonyl, cyano, halo, nitro, carboxy, trifluoromethyl, trifluoromethoxy, or methylenedioxy;

or a salt thereof.

In another embodiment the invention provides an apparatus comprising: a polymer of the invention including a source contact coupled to the polymer, a drain contact coupled to the polymer, and a gate contact coupled to the polymer through an insulative layer.

In another embodiment the invention provides an apparatus comprising: an electronic circuit; and a switch including a polymer of the invention coupled to the electronic circuit.

In another embodiment the invention provides a method comprising: forming a thin film including a polymer of the invention on a substrate; and forming an active electronic device in the polymer.

In another embodiment the invention provides an apparatus comprising: a substrate; and an electronic device included in the substrate, wherein the electronic device includes a polymer of the invention.

In another embodiment the invention provides a method for preparing a polymer of the invention comprising polymerizing the requisite monomer or monomers to provide the polymer of the invention.

In other embodiments, the invention also provides processes and intermediates disclosed herein (e.g. Compound 3a) that are useful for preparing polymers of formula I.

BRIEF DESCRIPTION OF THE FIGURES

FIG. 5 shows a cyclic voltammogram for compound 3a.

FIG. 6 shows a cyclic voltammogram for polymer 4a.

FIG. 7 shows comparative cyclic voltammograms of electropolymerized poly(thieno[3,4-b]pyrazine) and polymer 4a, as well as differential pulse voltammetry of 4a.

FIG. 8 shows the visible-NIR spectrum of polymer 4a.

FIG. 9 shows a spectroelectrochemical analysis of polymer 4a.

DETAILED DESCRIPTION

Figure 1:
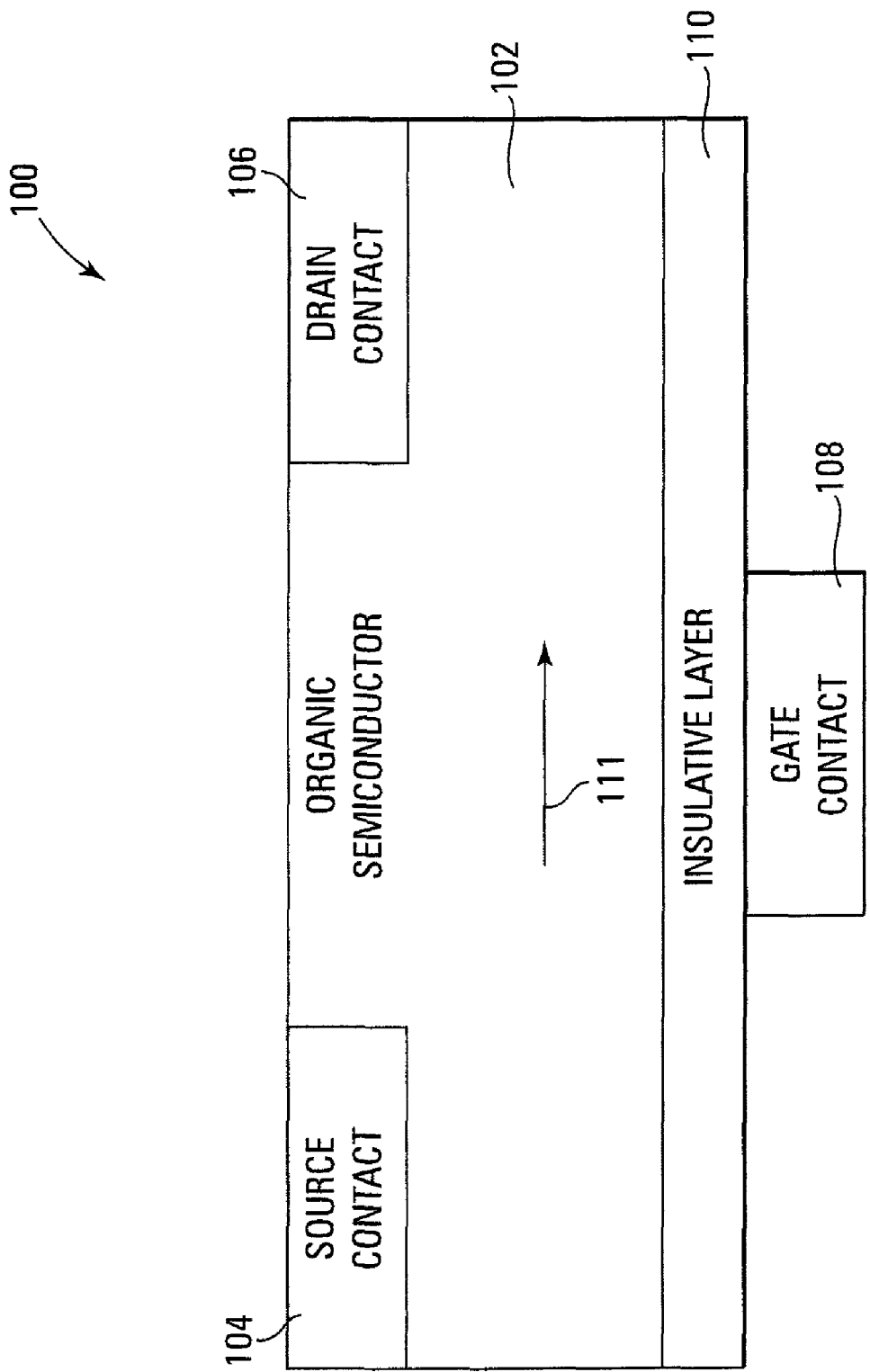
FIG. 1 is a block diagram of an apparatus including an organic semiconductor polymer of the invention having a source contact coupled to the organic semiconductor, a drain contact coupled to the organic semiconductor, and a gate contact coupled to the organic semiconductor through an insulative layer in accordance with some embodiments.

The following definitions are used, unless otherwise described: halo is fluoro, chloro, bromo, or iodo. Alkyl, alkoxy, alkenyl, alkynyl, etc. denote both straight and branched groups; but reference to an individual radical such as propyl embraces only the straight chain radical, a branched chain isomer such as isopropyl being specifically referred to. Aryl denotes a phenyl radical or an ortho-fused bicyclic carbocyclic radical having about nine to ten ring atoms in which at least one ring is aromatic.

Specific values listed below for radicals, substituents, and ranges, are for illustration only; they do not exclude other defined values or other values within defined ranges for the radicals and substituents.

Specifically, $(C_1-C_{12})$alkyl can be methyl, ethyl, propyl, isopropyl, butyl, iso-butyl, sec-butyl, pentyl, 3-pentyl, or hexyl; $(C_3-C_{12})$cycloalkyl can be cyclopropyl, cyclobutyl, cyclopentyl, or cyclohexyl; $(C_2-C_{12})$alkenyl can be vinyl, allyl, 1-propenyl, 2-propenyl, 1-butenyl, 2-butenyl, 3-butenyl, 1,-pentenyl, 2-pentenyl, 3-pentenyl, 4-pentenyl, 1-hexenyl, 2-hexenyl, 3-hexenyl, 4-hexenyl, or 5-hexenyl; $(C_2-C_{12})$alkynyl can be ethynyl, 1-propynyl, 2-propynyl, 1-butynyl, 2-butynyl, 3-butynyl, 1-pentynyl, 2-pentynyl, 3-pentynyl, 4-pentynyl, 1-hexynyl, 2-hexynyl, 3-hexynyl, 4-hexynyl, or 5-hexynyl; $(C_1-C_{12})$alkanoyl can be acetyl, propanoyl or butanoyl; $(C_1-C_{12})$alkoxycarbonyl, is methoxycarbonyl, ethoxycarbonyl, propoxycarbonyl, isopropoxycarbonyl, butoxycarbonyl, isobutoxycarbonyl, sec-butoxycarbonyl, pentoxycarbonyl, 3-pentoxycarbonyl, or hexyloxycarbonyl; and aryl can be phenyl, indenyl, or naphthyl.

A specific polymer of formula (I) is a polymer of formula (II):

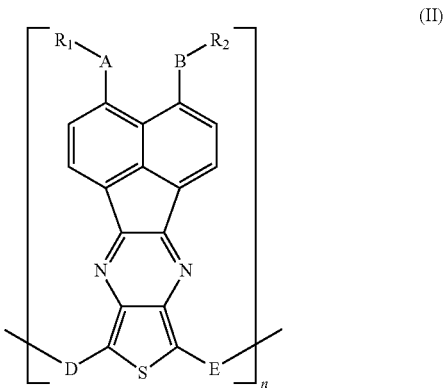

(II)

wherein n is 2-100.

A specific value for A is a bond.
A specific value for B is a bond.
A specific value for D is absent.
A specific value for D is thienyl.

A specific value for D is bithienyl.
A specific value for D is terthienyl.
A specific value for D is quaterthienyl.
A specific value for D is fluorenyl.
A specific value for E is absent.
A specific value for E is thienyl.
A specific value for E is bithienyl.
A specific value for E is terthienyl.
A specific value for E is quaterthienyl.
A specific value for E is fluorenyl.
A specific value for n is 20-30.
A specific value for A is a bond and $R_1$ is H, $(C_1-C_{12})$alkyl, cyano, fluoro, chloro, bromo, or $NH_2$.
A specific value for B is a bond and $R_2$ is H, $(C_1-C_{12})$alkyl, cyano, fluoro, chloro, bromo, or $NH_2$.
A specific value for $R_2$ is $(C_1-C_{12})$alkyl.
A specific value for $R_2$ is octyl.
A specific polymer of formula (I) is a polymer of formula (III):

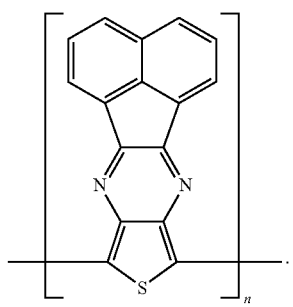

(III)

A specific polymer of formula (I) is a polymer of formula (V):

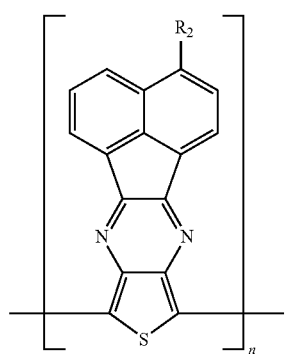

(V)

wherein $R_2$ has any of the values described herein.

A specific value for n in a polymer of formula II, III, or V is 20-30.

In one specific embodiment, the invention provides a method for preparing a polymer of formula (II):

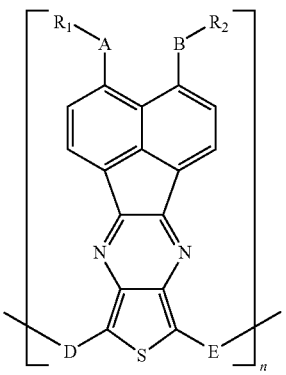

(II)

wherein n is 2-100, comprising polymerizing the requisite monomer or monomers to provide the polymer of formula (II). The polymerization can be carried out using any suitable polymerization technique, such as, for example, electropolymerization, oxidative chemical polymerization, or transition metal mediated polymerization.

In another specific embodiment, the invention provides a method for preparing a polymer of formula (II) wherein D and E are each absent, comprising polymerizing a corresponding compound of formula (IV):

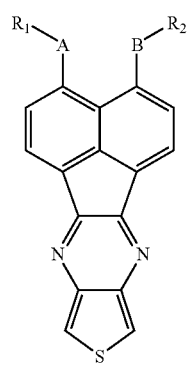

(IV)

to provide the polymer of formula (II).

Generally, representative compounds of the invention can be prepared as illustrated below.

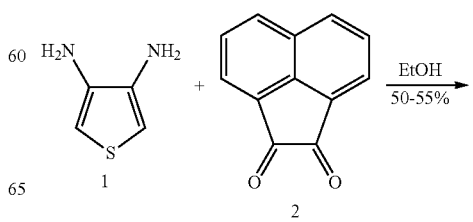

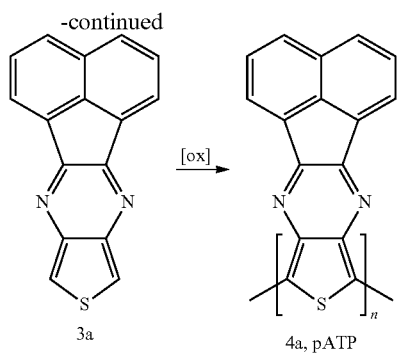

3a          4a, pATP

Monomer 3a is readily produced from the intermediate 3,4-diaminothiophene (1), obtained from the reduction of 2,5-dibromo-3,4-dinitrothiophene. See D. D. Kenning, K. A. Mitchell, T. R. Calhoun, M. R. Funfar, D. J. Sattler, and S. C. Rasmussen, *J. Org. Chem.*, 2002, 67, 9073; and L. Wen and S. C. Rasmussen, *J. Chem. Crystallogr.*, 2007, 37, 387.

Condensation of 1 with commercially available acenaphthene-quinone (2) gives a yellow crystalline solid in yields of 50-55%. Momomer 3a is surprisingly stable, with samples stored in the solid state at room temperature exhibiting no detectable oxidation or decomposition over periods exceeding one month.

Figure 5:
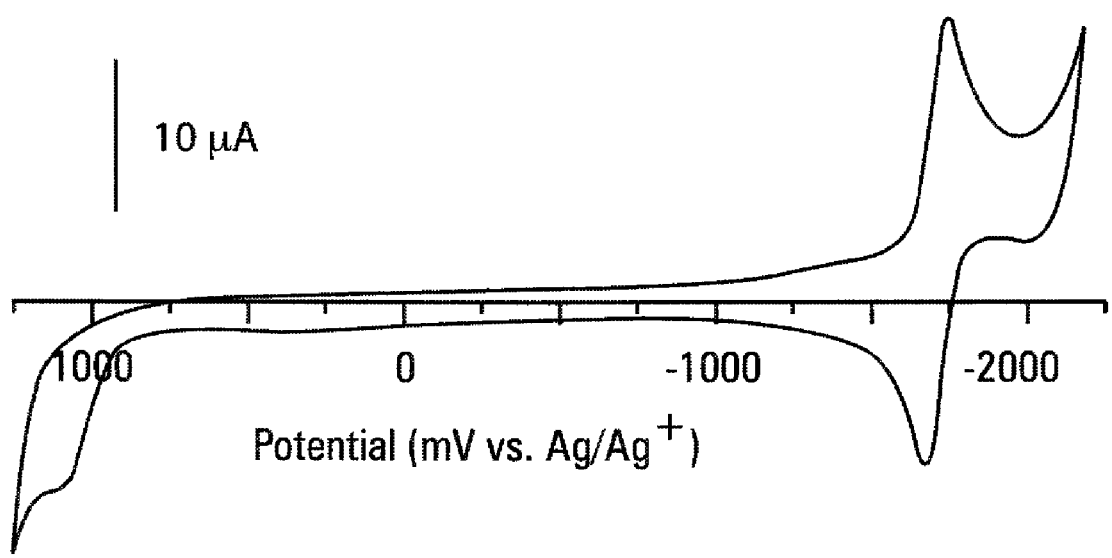

The cyclic voltammogram (CV) of 3a (FIG. 5) consists of an irreversible thiophene-based oxidation at 1.12 V and a quasi-reversible pyrazine-based reduction at −1.73 V (ΔE=74 mV). The nature of both redox waves are consistent with previously reported thieno[3,4-b]pyrazines (D. D. Kenning, K. A. Mitchell, T. R. Calhoun, M. R. Funfar, D. J. Sattler, *J. Org. Chem.*, 2002, 67, 9073), although both occur at decreased potential values due to the increased conjugation in 3a.

Figure 6:
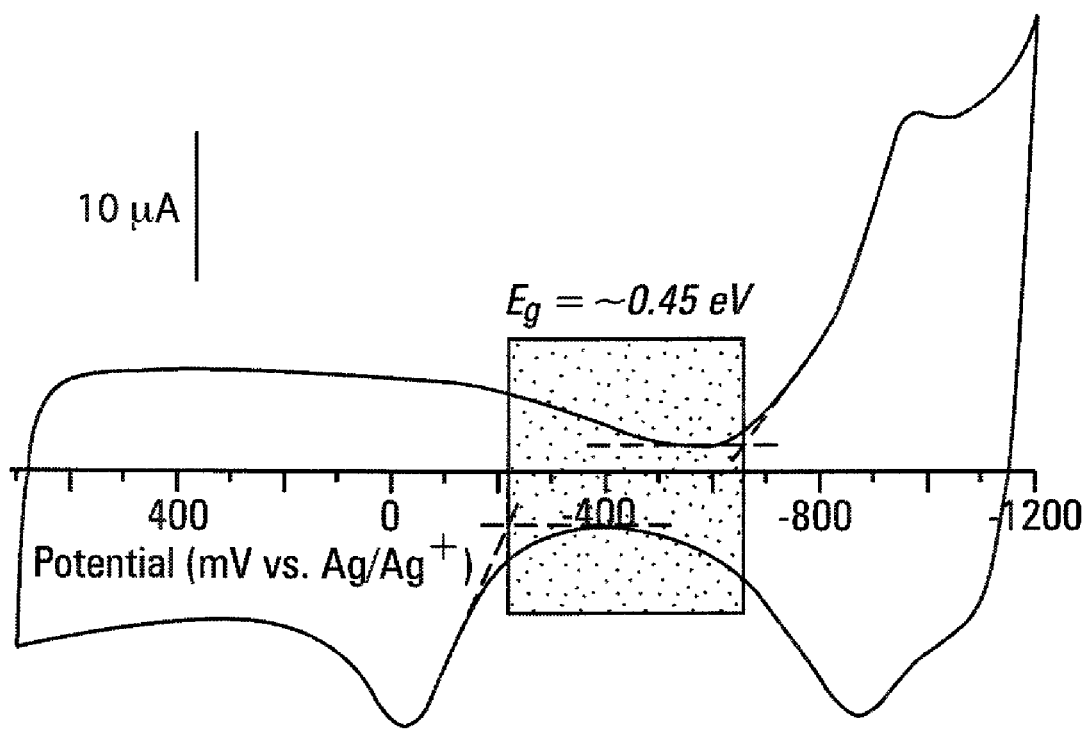
Figure 7A:
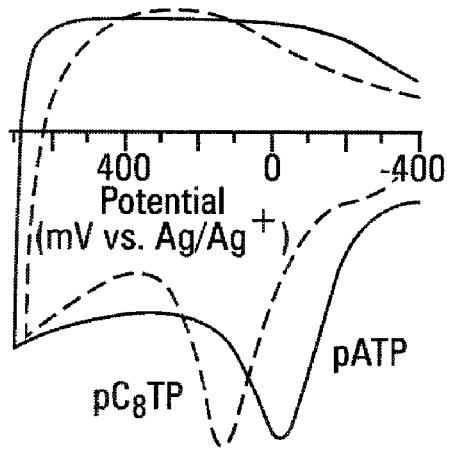
Figure 7B:
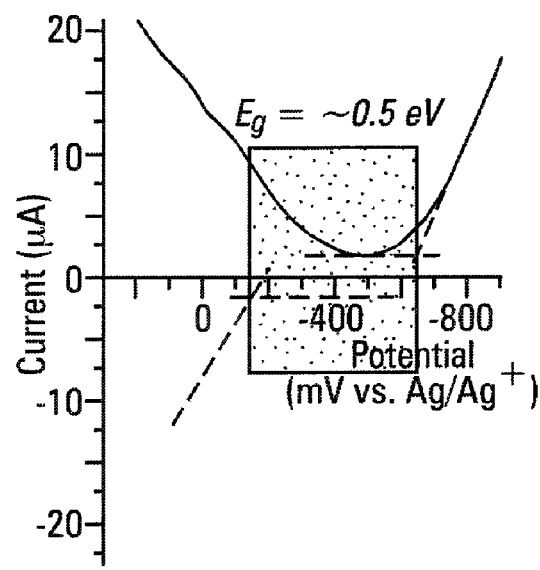

Polymeric films of pATP (polymer 4a) were produced by applying a constant potential of 1.5 V (vs. Ag wire quasireference) to saturated solutions of monomer 3a in $CH_2Cl_2$. The neutral films were burgundy in color and exhibited little to no solubility in organic solvents. A CV of the resulting pATP film (FIG. 6) exhibited a single well-defined oxidation with a $E_{pa}$ of ∼−25 mV. In comparison, the corresponding electropolymerized poly(thieno[3,4-b]pyrazine)s (pTPs) exhibited two oxidations (FIG. 7), a smaller peak occurring at ∼−250 mV followed by a more significant oxidation at 130 mV (A). Thus, the oxidation exhibited by the pATP film falls roughly between the two oxidative peaks of the previous pTP films and is significantly lower in potential than the more significant oxidation of the pTPs.

More noteworthy, however, are the very large differences in the reduction potentials of pTPs vs. pATP. Not only does the pATP reduction wave exhibit considerably more reversible character than the analogous pTP reductions, but the $E_{pc}$ of the pATP film occurs at ∼−970 mV, much lower than the corresponding reductions observed in the pTPs. This is important, as the band gap of a material is usually reduced by destabilizing the top of the valence band (HOMO), which leads to oxidatively unstable materials. In this case, the additional ring fusion to the repeat unit has little effect on the resultant polymer HOMO level, but significantly stabilizes the bottom of the conduction band (LUMO) resulting in a reduction in $E_g$ without decreasing the polymer stability.

Comparison of the oxidation and reduction onsets of the pATP film give a conservative estimate of the electrochemical band gap to be ∼0.45 eV. While there is some debate as to the most appropriate way to determine the band gap by CV, the use of onset potentials is more common as they give values that represent the minimum $I_p$ and maximum $E_a$ for the inhomogeneous polymer sample and would be most representative of the band edges of the ideal polymer structure free from conjugation limiting defects (see (a) S. Janietz, D. D. C. Bradley, M. Grell, C. Giebeler, M. Inbasekaran, and E. P. Woo, *Appl. Phys. Lett.*, 1998, 73, 2453; and (b) E. Kinbara, Y. Kunugi, Y. Harima, and K. Yamashita, *Synth. Met.*, 2000, 114, 295).

In order to determine more accurate values for the redox onsets, the pATP films were also investigated via differential pulse voltammetry. The advantage of DPV over typical CV is that contributions from capacitative current are minimized resulting in more sensitive current measurement. The DPV determined onsets agree well with the previous CV values, although the oxidation onset was found to be slightly more positive giving a slightly higher value of ∼0.5 eV for the band gap. Both electrochemically determined pATP values are in close agreement and are considerably lower than the $E_g$ values of ∼0.70-0.80 eV determined from the CVs of other pTPs (see D. D. Kenning and S. C. Rasmussen, *Macromolecules* 2003, 36, 6298).

While low band gap materials typically undergo oxidative doping at lower potentials, such materials have also been shown to be more sensitive to overoxidation. This is a common problem among conjugated polymers, which occurs at higher potentials resulting in the destruction of the polymer electroactivity. Thus, it was surprising to find that overoxidation does not seem to be a factor for polymers of the invention; no overoxidation processes were observed within the solvent window of $CH_2Cl_2$ (∼1.8 V).

Figure 8:
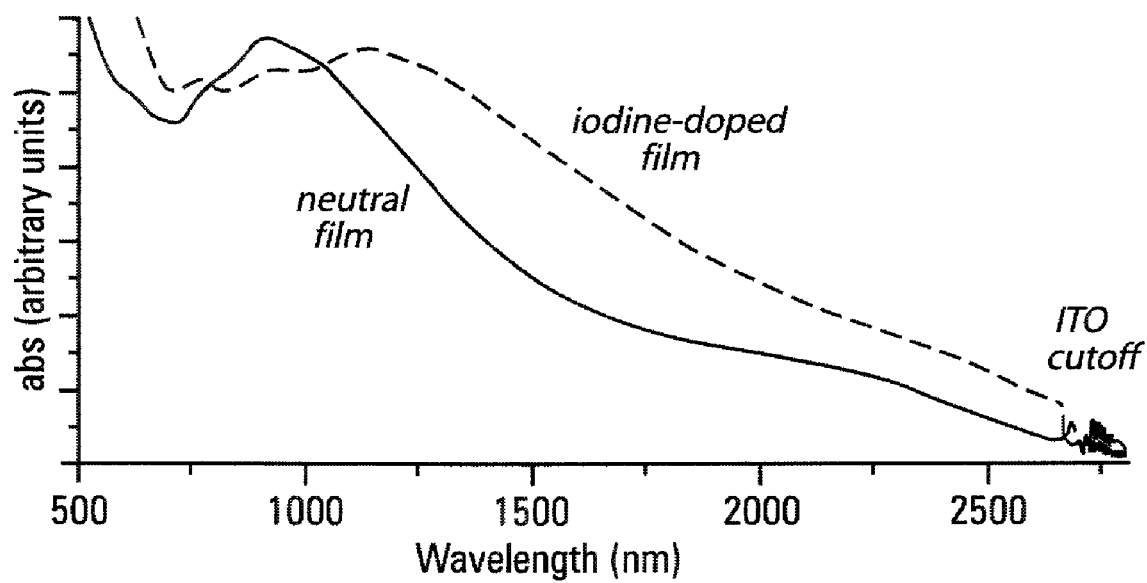

In order to investigate the solid-state optical properties of the pATP films, samples were also successfully grown on ITO (indium tin oxide) slides. The visible-NIR spectrum of pATP (FIG. 8) exhibits a $\lambda_{max}$ at ∼910 nm. Although this $\lambda_{max}$ is a bit higher in energy then the previously studied pTPs, it exhibits a long tailing down below 2700 nm (the spectra exhibit significant noise below 2700 nm due to additional intense absorption processes of the ITO electrode). Within this tailing appears to be a second lower energy transition centered around 2000 nm, which may be indicative of partial oxidation. Treatment of the film with iodine vapor resulted in a shift of the $\lambda_{max}$ to ∼1140 nm with an enhance-ment of the low energy absorption, further suggesting partial oxidation of the initial film.

Figure 9:
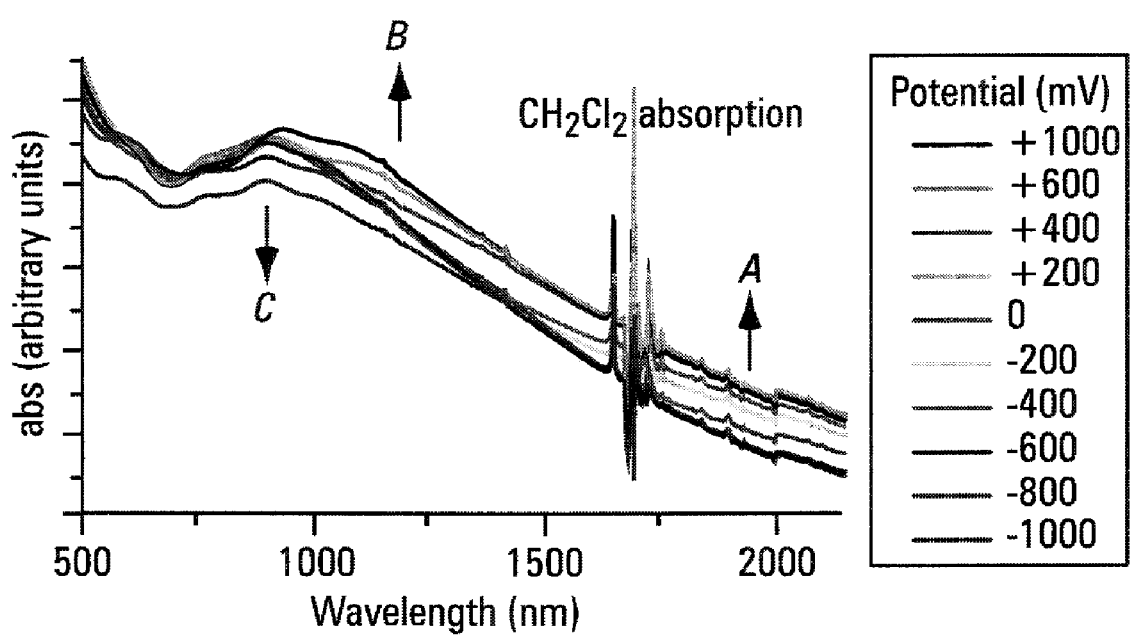

In order to determine if this low energy absorption was the result of some partial doping, films were further characterized via spectroelectrochemistry (FIG. 9). This verified that the absorption centered near 2000 nm (feature A) is indeed potential dependent, with the transition beginning to grow in at potentials more positive than −600 mV and maximizing at ∼0 mV. At increased positive potentials, a second absorption begins to grow in near 1200 nm (feature B), which agrees well with the iodine-doped spectrum shown above.

In order to see the effect of n-doping, reducing potentials were also applied to show that potentials more negative than −600 mV resulted in a bleaching of the primary absorption of the neutral film (feature C). The spectra of the neutral material exhibit an onset below 2200 nm, corresponding to an optical band gap of ∼0.55 eV. This value is in good agreement with the electrochemical values of ∼0.45 and 0.50 eV discussed above.

Representative intermediate monomers and polymers of the invention can also be prepared as illustrated in Schemes 1-7 below.

Scheme 1 Preparation of Representative Monomers
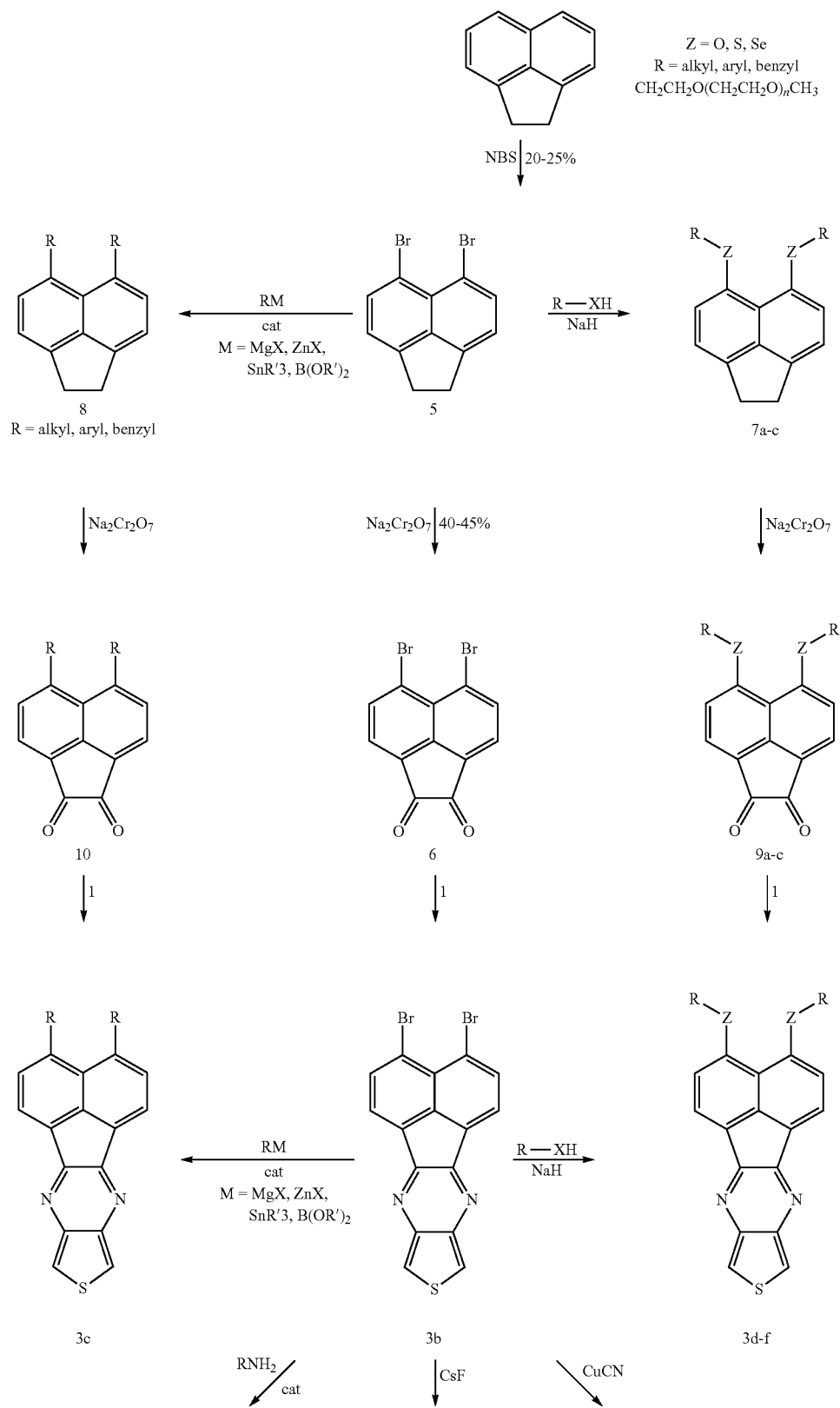

-continued
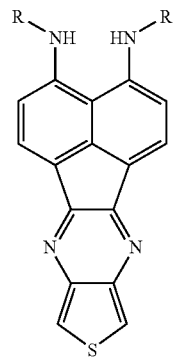
3g
R = alkyl,
aryl, benzyl
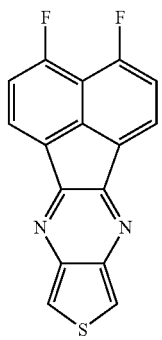
3h
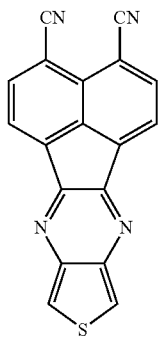
3i
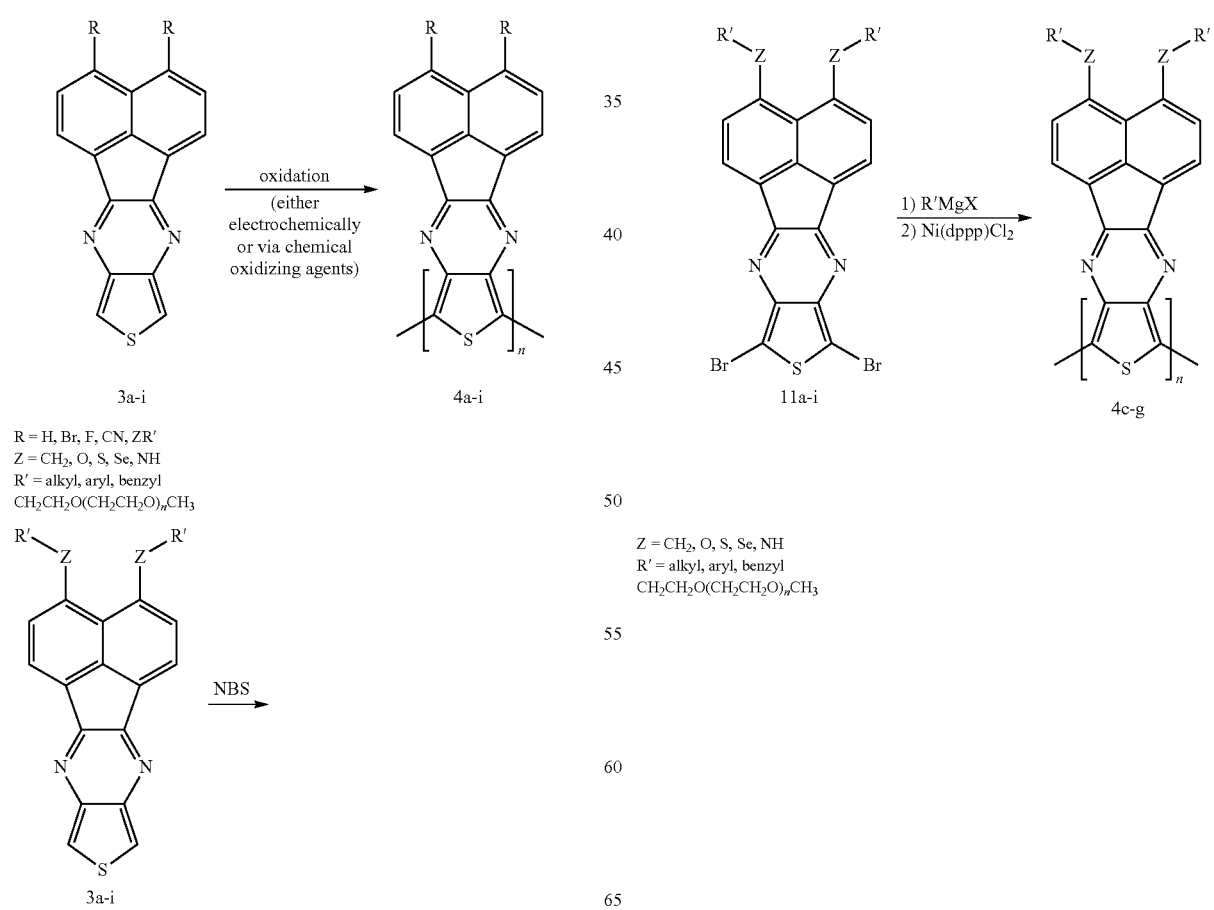

Scheme 3 Preparation of Representative Monomers wherein D and E are each Thienyl
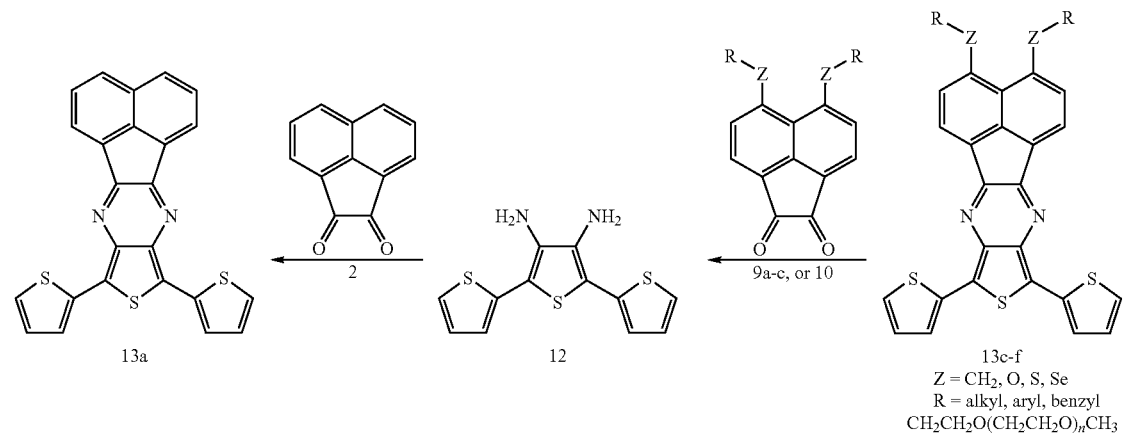
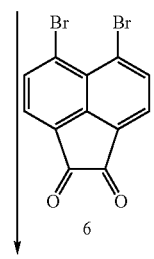
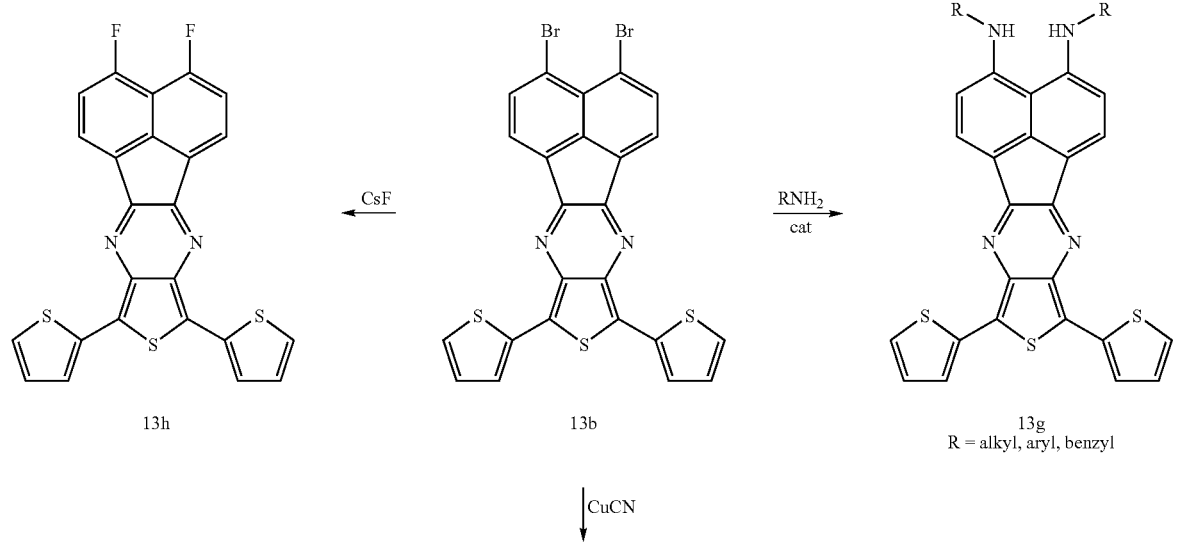

-continued
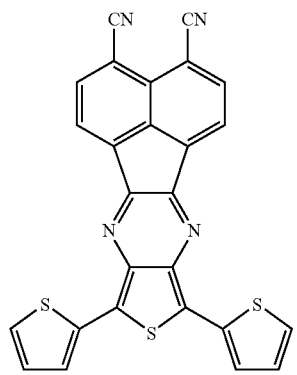
131
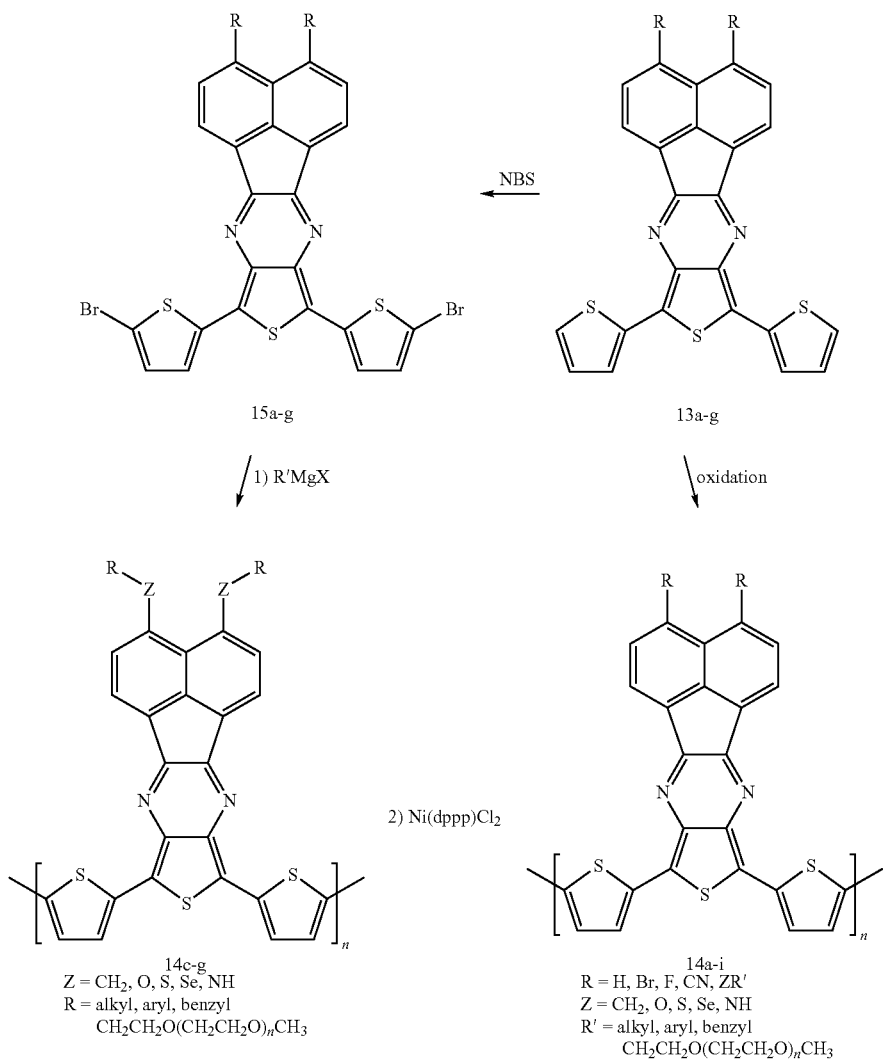
Scheme 4 Preparation of Representative Polymers of the Invention wherein E is Thienyl or Phenyl

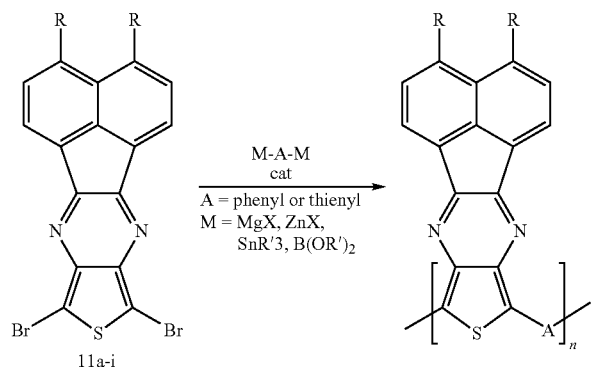
Scheme 5 Preparation of Representative Monomers
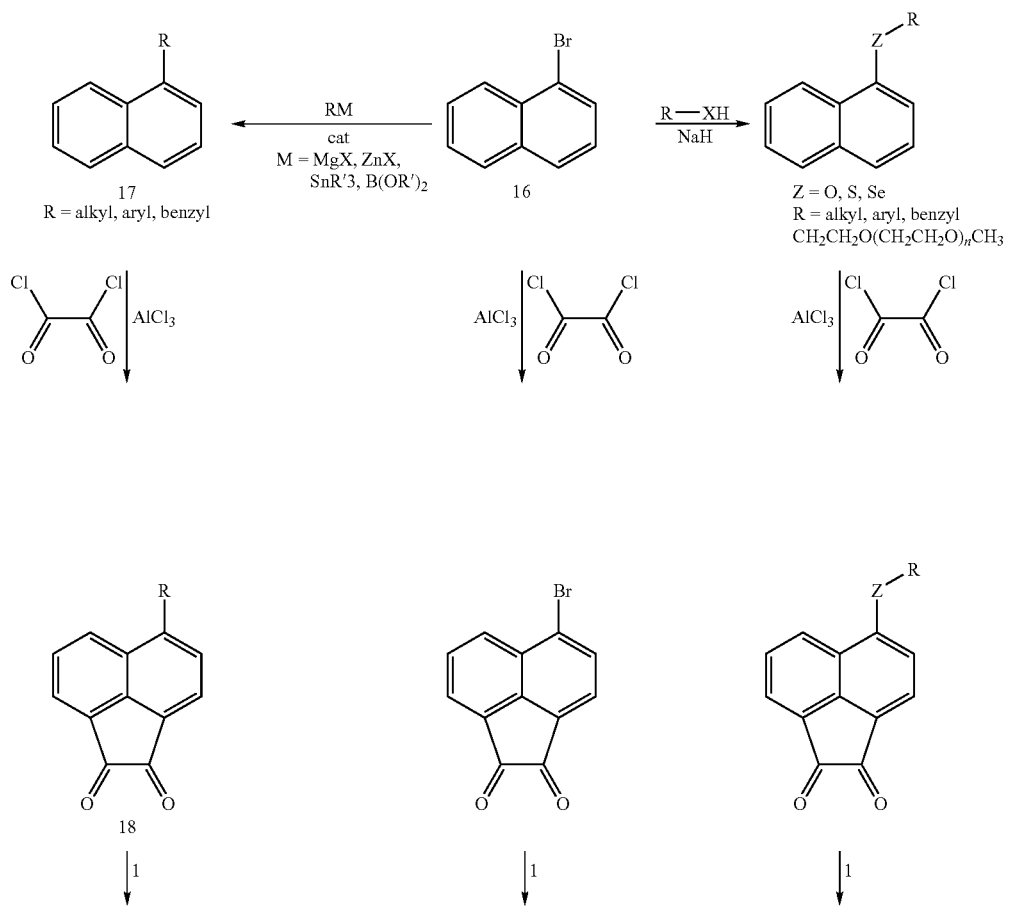

-continued
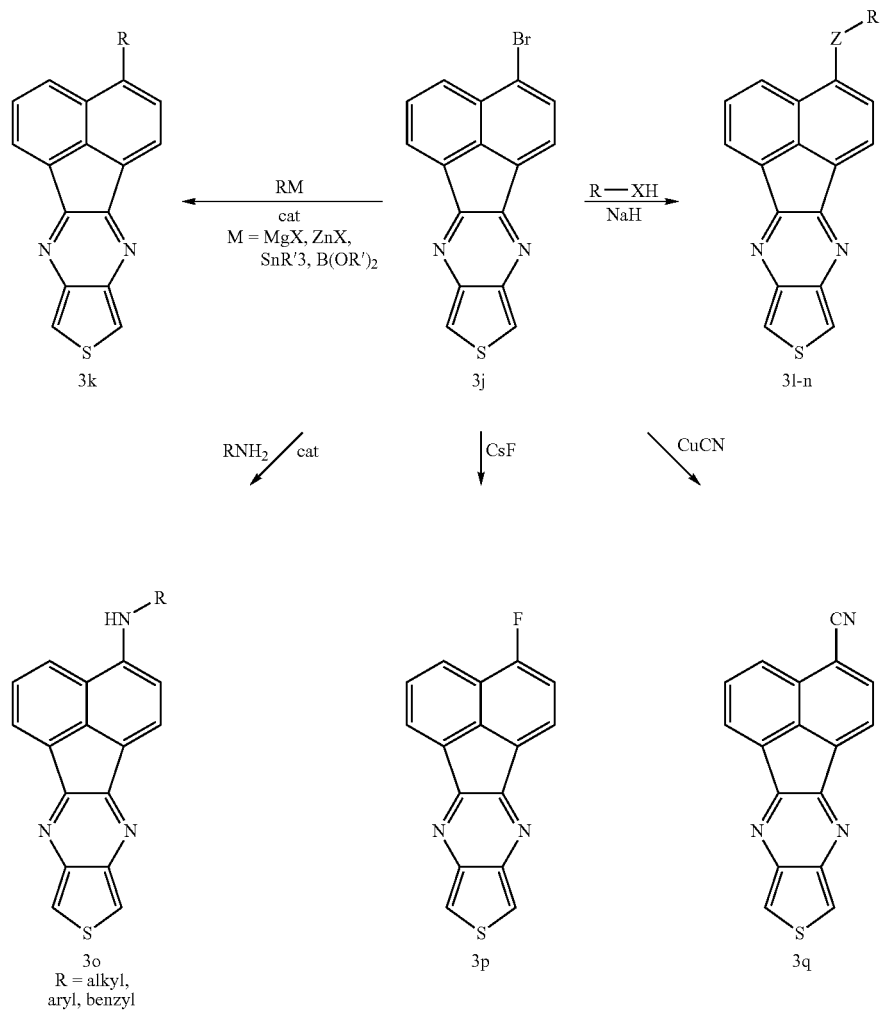
Scheme 6 Preparation of Representative Monomers and Polymers of the Invention
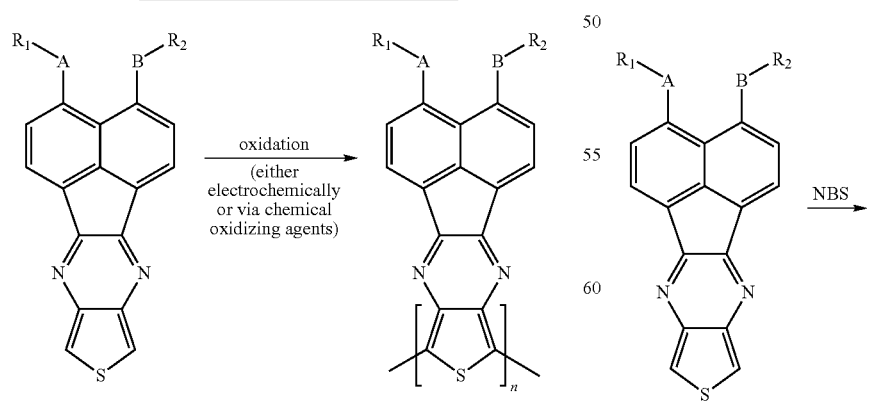
-continued

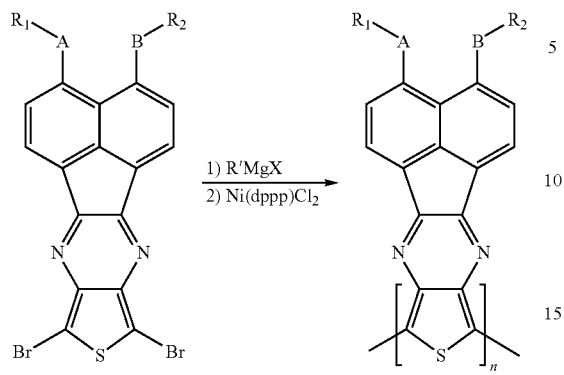
Scheme 7 Preparation of Representative Monomers and Polymers of the Invention
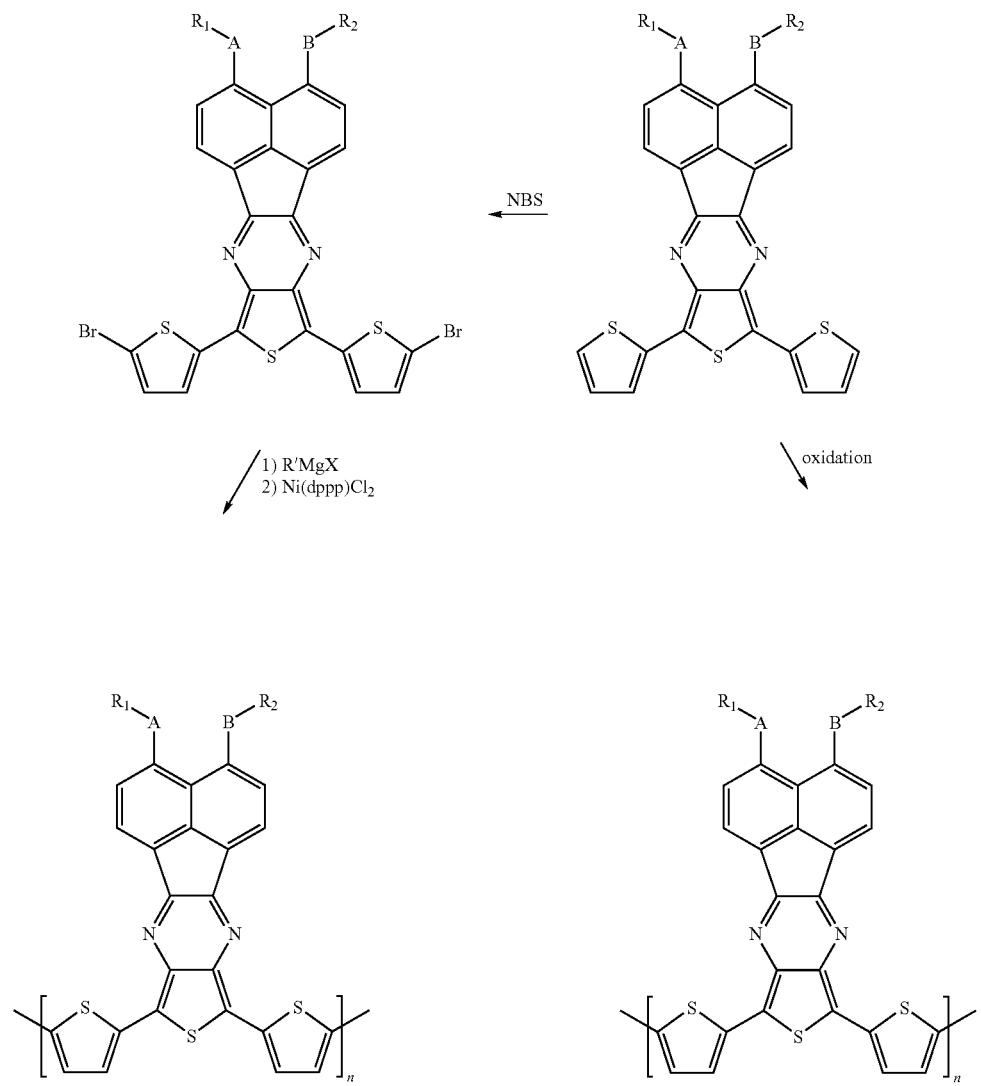

-continued

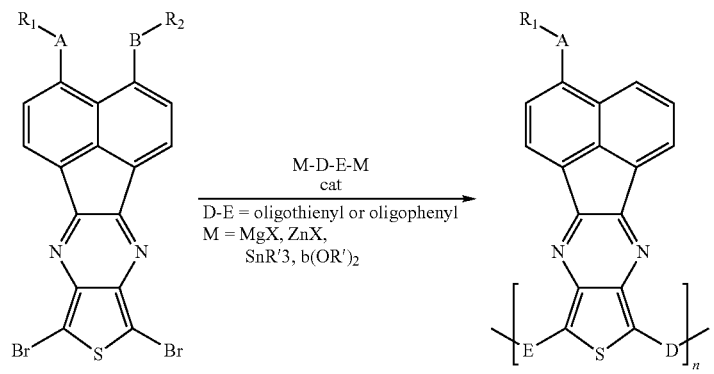

FIGURES

FIG. 1 is a block diagram of an apparatus 100 including a semiconductor 102 having a source contact 104 coupled to the semiconductor 102, a drain contact 106 coupled to the semiconductor 102, and a gate contact 108 coupled to the semiconductor 102 through an insulative layer 110. The semiconductor 102 includes polymer materials as described above. The source contact 104, drain contact 106, and gate contact 108 provide electrical connections to the semiconductor 102. The conductivity of the source contact 104, the drain contact 106, and the gate contact 108 is a value suitable to deliver electronic signals to the semiconductor 102. The insulative layer 110 is a substantial insulator in that the conductivity of the insulative layer 110 is less than the conductivity of the semiconductor 102. Silicon dioxide is an exemplary material suitable for use in connection with the fabrication of the insulative layer 110 in the apparatus 100. The apparatus 100, as shown in FIG. 1, is configured substantially as a metal-oxide semiconductor field-effect transistor. In operation, a control signal at the gate contact 108 of the apparatus 100 controls a current flow 111 between the source contact 104 and the drain contact 106. The control signal can decrease the flow of current to substantially zero between the source contact 104 and the drain contact 106. Alternatively, the control signal can increase and decrease the flow of current between the source contact 104 and drain contact 106. The increase or decrease can be directly or inversely proportional to the control signal. Therefore, in some embodiments, the apparatus 100 functions as a switch while in other embodiments, the apparatus 100 functions as an amplifier.

Figure 2:
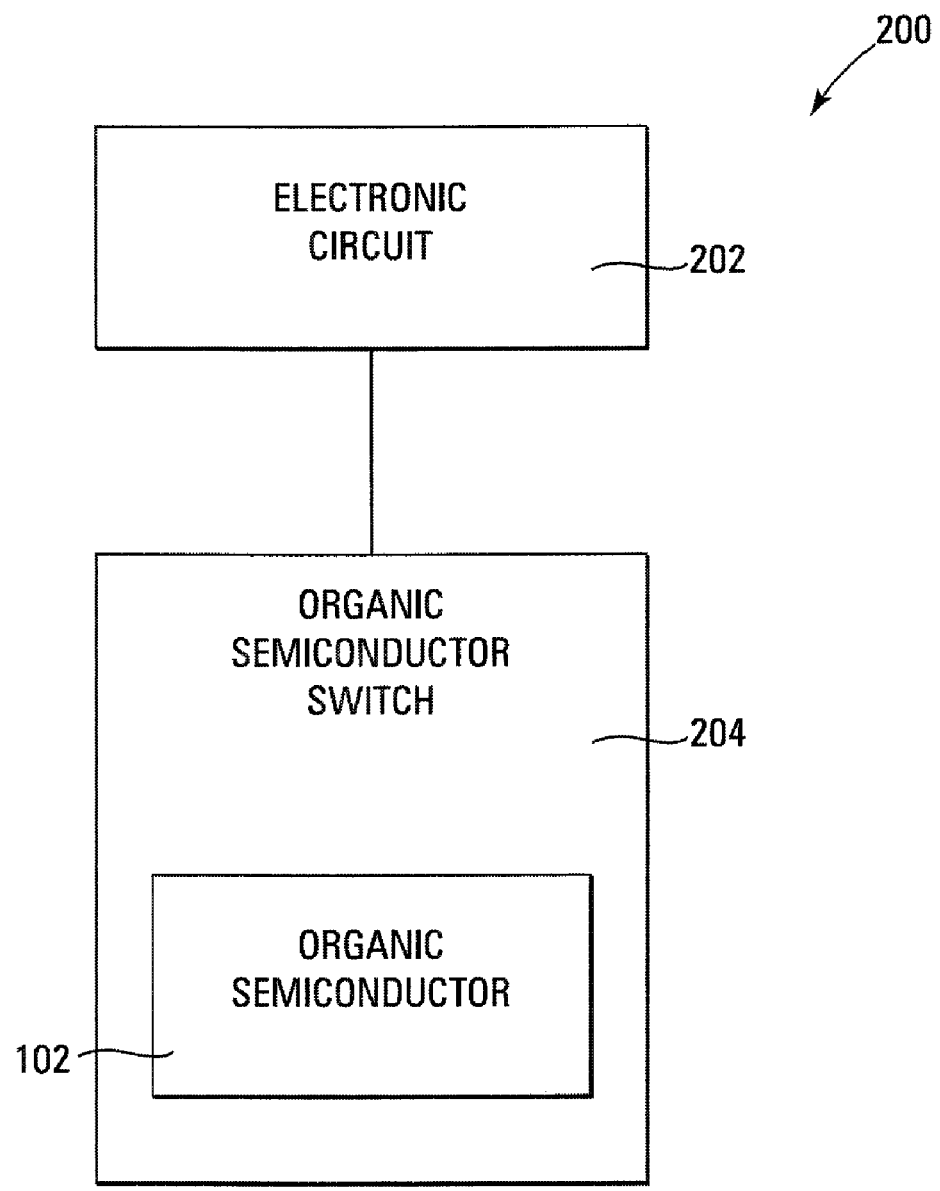
FIG. 2 is a block diagram of an apparatus including an electronic circuit coupled to an organic semiconductor switch in accordance with some embodiments.

FIG. 2 is a block diagram of an apparatus 200 including an electronic circuit 202 coupled to a semiconductor switch 204. The semiconductor switch 204 includes the semiconductor 102, shown in FIG. 1, and described above. The electronic circuit 202 is not limited to a particular type of circuit. In some embodiments, the electronic circuit 202 is a digital circuit. In other embodiments, the electronic circuit is an analog circuit. In still other embodiments, the electronic circuit 202 includes both analog and digital circuits.

Figure 3:
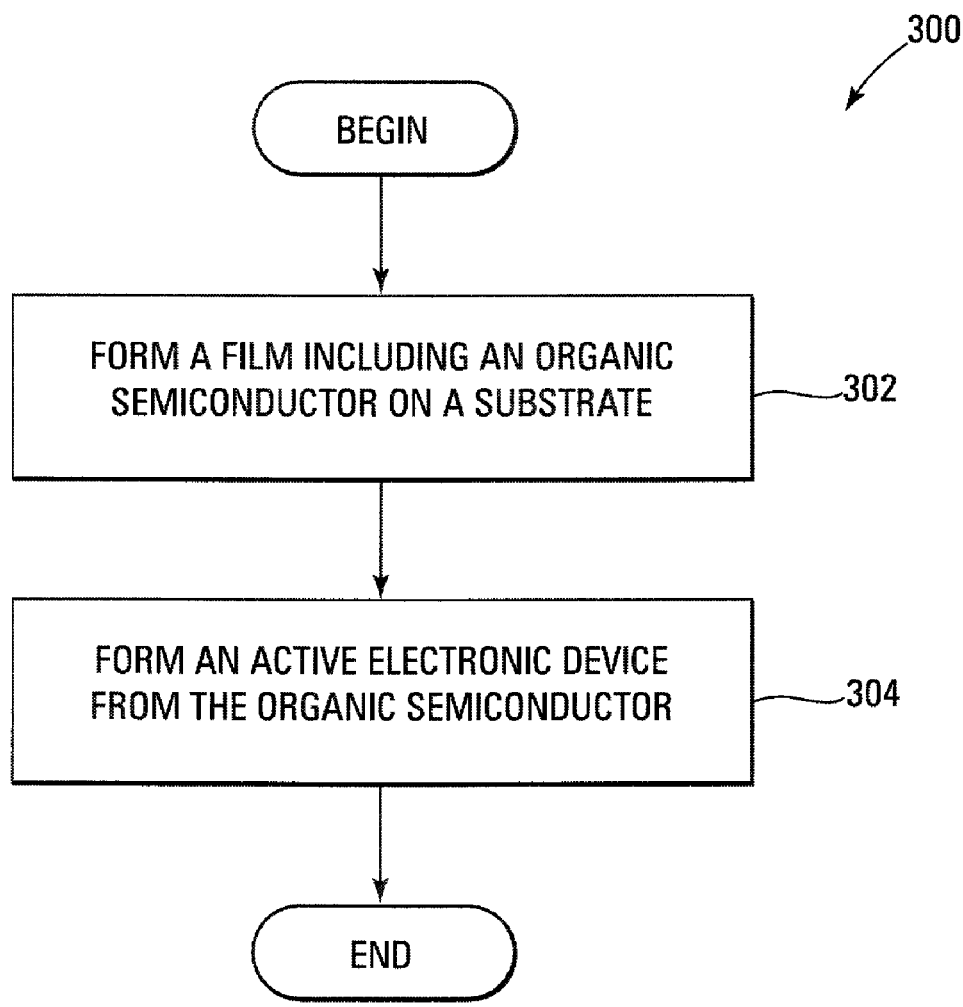
FIG. 3 is a flow diagram of a method including forming a thin film including an organic semiconductor on a substrate, and forming an active electronic device in the organic semiconductor in accordance with some embodiments.

FIG. 3 is a flow diagram of a method 300 including forming a thin film including a semiconductor polymer of the invention on a substrate 302, and forming an active electronic device in the semiconductor 304. In some embodiments, forming the active electronic device in the semiconductor includes forming an electronic switch within the semiconductor. In some embodiments, forming the electronic device in the semiconductor includes forming an optical device within the semiconductor.

Figure 4:
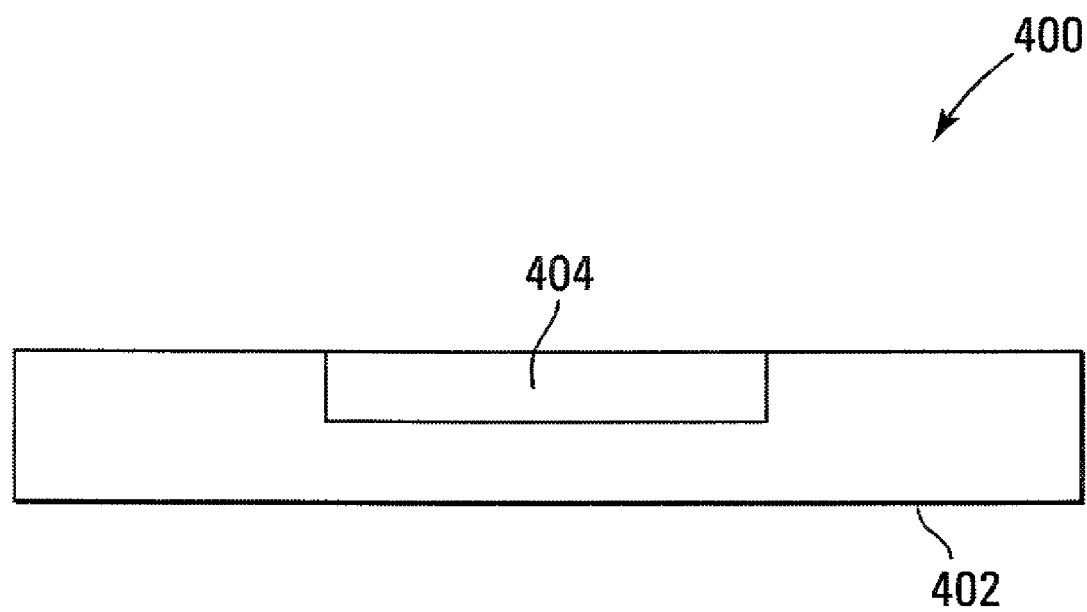
FIG. 4 shows an apparatus including a substrate and an electronic device (including a polymer of the invention) included in the substrate in accordance with some embodiments.

FIG. 4 shows an apparatus 400 including a substrate 402 and an electronic device 404 (including a polymer of the invention) included in the substrate 402. In some embodiments, the electronic device 404 is included in the substrate by being formed a surface of the substrate. In some embodiments, the electronic device 404 is included in the substrate by being formed within the substrate. And in some embodiments, the electronic device 404 is included in the substrate by being mixed with the substrate material before the substrate is formed. The apparatus 400 is not limited to being formed using a particular substrate. In some embodiments, the substrate includes a semiconductor. Exemplary semiconductors suitable for use in connection with the apparatus 400 include silicon, germanium, and gallium arsenide. The apparatus 400 is not limited to a particular electronic device. Exemplary electronic devices suitable for use in connection with the apparatus 400 include transistors, such as field-effect transistors and bipolar junction transistors. A filed-effect transistor includes a gate, a drain and a source. A bipolar junction transistor includes an emitter, a base and a collector. In some embodiments, the electronic device includes a sensor. In some embodiments, the apparatus 400 functions as a strain gauge, such as a strain gauge used in measuring the stresses on a bridge. In some embodiments the apparatus 400 functions as an accelerometer, such as an accelerometer used in airplanes or airbags.

The invention will now be illustrated by the following non-limiting examples. Unless otherwise specified, all reactions were carried out under nitrogen atmosphere with reagent grade materials. Chromatographic separations were performed using standard column methods with silica gel (230-400 mesh). The $^1$H and $^{13}$C NMR spectra were carried out on a 400 MHz spectrometer in $CDCl_3$. All NMR data was referenced to the chloroform signal and peak multiplicity was reported as follows: s=singlet, d=doublet, t=triplet.

EXAMPLES

Example 1

Preparation of Polymer 4a

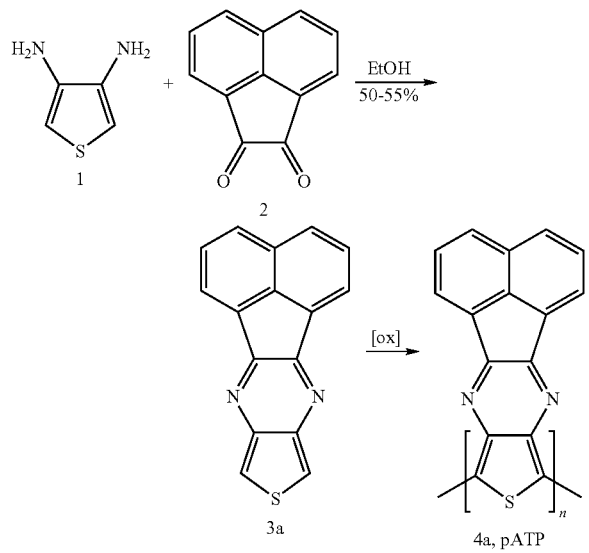

3,4-Diaminothiophene (1) was prepared from the reduction of 2,5-dibromo-3,4-dinitrothiophene as previously reported (see D. D. Kenning, K. A. Mitchell, T. R. Calhoun, M. R. Funfar, D. J. Sattler, and S. C. Rasmussen, *J. Org. Chem.*, 2002, 67, 9073; and L. Wen and S. C. Rasmussen, *J. Chem. Crystallogr.*, 2007, 37, 387).

Acenaptho[1,2-b]thieno[5,4-e]pyrazine (3a). Diaminothiophene 1 (1.3 g, 11.4 mmol) was dissolved in 80 mL of absolute ethanol. 1,2-Acenapthenequinone (2.5 g, 13.7 mmol) was then added and the solution heated at reflux for 3 hours. The mixture was then cooled to room temperature, diluted with 200 mL of water, and extracted with dichloromethane. The combined organic layers were dried with anhydrous $Na_2SO_4$ and the solvent removed by rotary evaporation. The resulting solid was then dissolved in $CH_2Cl_2$, run through a 5 cm silica plug, and concentrated to give a yellow solid. A final recrystallization from methanol gave yellow needles of 3a (1.6 g, 54%). mp: ~150° C. (dec); $^1$H NMR: □8.25 (dd, J=7.2, 0.4 Hz, 2H), 8.03 (dd, J=8.4, 0.4 Hz) 2H), 7.98 (s, 2H), 7.77 (dd, J=8.4, 7.2 Hz, 2H); $^{13}$C NMR: □154.5, 142.1, 138.5, 131.7, 130.4, 129.3, 128.9, 121.1, 117.8.

Polymer (4a). Electropolymerization of monomer 3a was carried out in a three-electrode cell consisting of a working electrode (either a platinum disc or an indium tin oxide (ITO) coated slide), a platinum wire auxiliary electrode, and a silver wire quasi-reference electrode. Solutions consisted of monomer 3a (0.06 M) dissolved in anhydrous $CH_2Cl_2$ with 0.10 M tetrabutylammonium hexafluorophosphate ($TBAPF_6$) as the supporting electrolyte. The solutions were deoxygenated by sparging with argon prior to each scan and blanketed with argon during the polymerizations. The platinum disc working electrode was polished with 0.05 mm alumina and washed well with deionized water and dry $CH_2Cl_2$ prior to each film growth. The polymer films were grown at a constant potential of 1.75 V. The resulting polymer films were then conditioned by cycling several times. The polymer-coated electrode was then removed, washed with dry $CH_2Cl_2$ and placed in a cell with a fresh electrolyte solution. The neutral polymer films were burgundy in color and exhibited little to no solubility in organic solvents.

Cyclic voltammetry (CV) were carried out in the cell described above at a sweep rate of 100 mV/s. The solutions were argon sparged and blanketed as described above. Potentials were referenced to the ferrocene redox couple (45 mV vs. Ag/Ag$^+$).

Differential pulse voltammetry (DPV) was performed on electropolymerized films of pATP for additional determination of the redox onsets. Measurements were of the pATP films on a platinum disc working electrode. Conditions and cell configuration were the same as for the CV measurements above, with the exception that the sweep rate was reduced to 20 mV/s. Both positive and negative sweeps were measured in order to determine accurate onsets for both the oxidation and reduction of the polymer film.

Analysis of monomer 3a by CV was carried out in the cell described above, substituting a Ag/Ag$^+$ reference electrode (0.251 V vs. SCE, see R. C. Larson, R. T. Iwamoto, and R. N. Adams, *Anal. Chim. Acta*, 1961, 25, 371 for the silver wire quasi-reference). Solutions consisted of monomer (0.06 M) dissolved in spectral grade $CH_3CN$ with 0.10 M $TBAPF_6$ as the supporting electrolyte. All scans were performed at a sweep rate of 100 mV/s and solutions were argon sparged and blanketed as described above.

Visible-NIR spectroscopy was performed on a dual beam scanning UV-vis-NIR spectrophotometer using polymer samples grown on ITO slides as stated above. After polymerization, the polymer-coated electrode was held at a reducing potential to ensure dedoping of the film. The film was then washed with $CH_2Cl_2$ and dried. Spectroscopy was conducted on the films with reference to blank ITO slides. Spectroelectrochemistry was performed in a 1-cm quartz cuvette equipped with a polymer-coated ITO working electrode, a platinum wire auxiliary electrode, and a silver wire quasi-reference electrode. The cell solution consisted of 0.1 M $TBAPF_6$ in dry $CH_2Cl_2$. The ITO slide/polymer film was held at the desired potential for 120 seconds before measurement of the spectrum.

Example 2

Preparation of Monomer 3b (Scheme 1)

5,6-dibromoacenaphthene (5). Adapted from a previously reported procedure (see Mallory, F. B., et al.; *J. Am. Chem. Soc.* 2000, 122(17), 4108-4116). Acenaphthene (25.0 g, 162.1 mmol) and N-bromosuccinimide (72.15 g, 405 mmol) were dissolved in DMF (200 mL) and stirred overnight at 30-35° C. Following, the reaction mixture was cooled to room temperature, filtered and the crude product was recrystallized with hexanes to give light brown crystals of 5,6-dibromoacenaphthene (10.3 g, 20%). mp: 169.4-171.6 □C. $^1$H NMR: δ 7.78 (d, J=7.6 Hz, 2H), 7.07 (d, J=7.6 Hz, 2H), 3.30 (s, 4H). $^{13}$C NMR: δ 147.3, 142.16, 136.0, 128.0, 121.1, 114.6, 30.3.

5,6-dibromoacenaphthalenequinone (6). Adapted from a previously reported procedure (see Mallory, F. B., et al.; *J. Am. Chem. Soc.* 2000, 122(17), 4108-4116). $Na_2Cr_2O_7$ (37.8 g, 126.7 mmol) was added to a suspension of 5 (6.6 g, 21.1 mmol) in glacial acetic acid (350 mL). The mixture was then heated to 80° C. for 2 hours, diluted with 1000 mL of water, and filtered. The precipitate was treated with 30 mL of boiling aqueous 6% $Na_2CO_3$ to give crude 5,6-dibromoacenaphthenequinone. Small portions of the crude product were added to 500 mL of 55° C. chlorobenzene until saturation was reached. A 40% solution (20 mL) of sodium bisulfite and water was added and stirred for 1 hour. The white precipitate that formed was filtered and washed with 25 mL of 10% aqueous HCl. The resulting yellow solid was recrystallized from chlorobenzene to give 5,6-dibromoacenaphthalene-quinone as yellow crystals (2.0 g, 28.2%). mp: 325.2-328.1° C. $^1$H NMR: δ 8.26 (d, J=7.6 Hz, 2H), 7.93 (d, J=7.6 Hz, 2H).

3,4-dibromoacenaphthene[1,2-b]thieno[3,4-e]pyrazine (3b). Diaminothiophene 1 (0.25 g, 2.1 mmol) was dissolved in 100 mL of absolute ethanol. Intermediate 6 (0.72 g, 2.1 mmol) was then added and the solution was heated to reflux for 5 hours. The mixture was cooled to room temperature, diluted with 100 mL of water, and extracted with dichloromethane. The combined organic layers were dried with anhydrous magnesium sulfate and the solvent removed by rotary evaporation. The resulting yellow solid was then purified by recrystallization in dichloromethane to yield yellow needles of 3,4-dibromoacenaphthene[1,2-b]thieno[3,4-e]pyrazine (0.12 g, 14%). mp: ~130° C. (dec.). $^1$H NMR: δ 8.21 (d, J=7.6 Hz, 2H), 8.11 (d, J=7.6 Hz, 2H), 8.04 (s, 2H).

Example 3

Preparation of Polymer 20

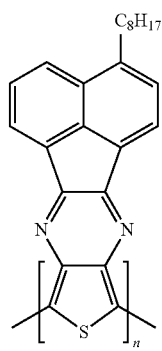

20

1-Octylnapthalene (17, Scheme 5, wherein R=octyl). In a dry $N_2$ purged flask, octylmagnesium bromide (100 mmol), Ni(dppp)Cl$_2$ (0.4 g, 1 mol %), zinc chloride (10.2 g, 75 mmol), and THF (100 mL) were added and allowed to stir for 30 minutes before 1-bromonapthalene (10.43 mL, 75 mmol) was added slowly. The solution was then heated to reflux overnight before being quenched with saturated ammonia chloride (150 mL). The crude 1-octylnapthalene was then extracted with hexanes (3×50 mL), washed with H$_2$O (100 mL), and dried with anhydrous magnesium sulfate. The solvent was filtered and removed via rotary evaporation. The resulting oil was diluted with hexanes (10 mL) and purified by column chromatography (silica, hexanes) yielding 1-octylnapthalene as a colorless oil (16.9 g, 93%). $^1$H NMR: δ 8.09 (d, J=8.4 Hz, 1H), 7.89 (d, J=8 Hz, 1H), 7.24 (d, J=8 Hz, 1H), 7.518 (m, 2H), 7.430 (dt, J=8.4 Hz, 6.8 Hz, 1H), 7.36 (d, J=6.8 Hz, 1H), 3.10 (t, J=8 Hz, 2H), 1.79 (p, J=8.0 Hz, 2H), 1.48 (m), 1.34 (m), 0.93 (t, J=7.2 Hz, 6.8 Hz, 3H). $^{13}$C NMR: δ 139.3, 134.1, 132.2, 129.0, 126.6, 126.1, 125.8, 125.7, 125.6, 124.2, 33.4, 32.2, 31.1, 30.1, 29.8, 29.6, 22.9, 14.4

5-Octylacenaphylene-1,2-dione (18, Scheme 5, wherein R=octyl). Oxalyl chloride (6.47 g, 50 mmol) was added to a stirred suspension of AlCl$_3$ (13.3 g, 100 mmol) in dichloromethane (300 mL) under N$_2$ at −5° C. After drop wise addition of 1-octylnapthalene (12.02 g, 50 mmol) was diluted in dichloromethane (100 mL) and added dropwise to the reaction mixture. The new mixture was allowed to stir for an additional 5 hours making sure the temperature did not get above 0° C. The reaction mixture was then quenched by pouring over ice (200 g). The quenched solution was allowed to warm to room temperature and the resulting layers separated. The organic layer was washed with a saturated solution of sodium bicarbonate (1×100 mL) and water (1×100 mL) after which it was dried with anhydrous magnesium sulfate. The solvent was filtered and removed by rotary evaporation resulting in the crude product. The product was purified by column chromatography (silica, 10% EtOAc in Hexanes) yielding a yellow solid of 5-octylacenaphylene-1,2-dione (3.74 g, 30%). $^1$H NMR: δ 8.33 (d, J=8.4 Hz, 1H), 8.01 (d, J=6.8 Hz, 1H), 7.98 (d, J=7.2 Hz, 1H), 7.80 (dt, J=7.2 Hz, 6.8 Hz, 1H), 7.62 (d, J=7.2 Hz, 1H), 3.16 (t, J=8 Hz, 2H) 1.78 (p, J=8 Hz, 2H), 1.44 (m, 2H), 1.25 (m, 8H), 0.85 (t, J=7.2 Hz, 3H). $^{13}$C NMR: δ 189.1, 187.9, 147.8, 146.4, 130.1, 129.9, 129.1, 128.1, 127.2, 126.8, 122.4, 121.7, 33.3, 32.0, 30.8, 29.9, 29.6, 29.4, 22.8, 14.3.

5-Octylacenaptho[1,2-b]thieno[5,4-e]pyrazine (3k, Scheme 5, wherein R=octyl). Diaminothiophene 1 (0.507 g, 5.0 mmol) was dissolved in 50 mL of absolute ethanol. Octylacenaphylene dione (1.246 g, 5.0 mmol) was then added and the solution was heated at reflux for 3 hours. The mixture was then cooled to room temperature, diluted with 100 mL of water, and extracted with dichlormethane. The combined organic layers were dried with anhydrous magnesium sulfate and the solvent removed by rotary evaporation. The resulting oily solid was then purified by column chromatography (50% CH$_2$Cl$_2$ in hexanes) yielding a yellow solid of 5-octylacenaptho[1,2-b]thieno[5,4-e]pyrazine (0.37 g, 20%. $^1$H NMR: δ 8.3 (d, J=6.8 Hz, 1H), 8.22 (dd, J=8.0 Hz, 7.2 Hz, 2H), 7.98 (dd, J=8.4 Hz, 8.0 Hz, 2H), 7.82 (t, J=6.8 Hz, 1H), 7.63 (d, J=7.2 Hz, 1H) 3.192 (t, J=7.6 Hz, 2H), 1.83 (p, J=7.6 Hz, 2H), 1.47 (m, 2H) 1.31 (m, 8H), 0.83 (t, J=7.2 Hz, 3H). $^{13}$C NMR: 154.7, 154.4, 143.6, 142.1, 142.0, 138.0, 132.0, 129.6, 129.5, 128.4, 128.3, 126.4, 121.2, 120.7, 117.6, 117.3, 32.8, 32.1, 31.6, 30.0, 29.7, 29.5, 22.9, 14.3.

Polymer (20). Electropolymerization experiments were carried out in a three-electrode cell consisting of a platinum disc working electrode, a platinum wire auxiliary electrode, and a silver wire quasi-reference electrode. Solutions consisted of monomer 3k (0.05 M) dissolved in anhydrous CH$_3$CN. The supporting electrolyte was 0.10 M TBAPF$_6$. The solutions were deoxygenated by sparging with argon prior to each scan and blanketed with argon during the polymerizations. The platinum disc working electrode was polished with 0.05 mm alumina and washed well with deionized water and dry CH$_3$CN prior to each film growth. The films were grown at a constant potential corresponding to the monomer $E_{pa}$. The polymer-coated electrode was then removed, washed with CH$_3$CN and placed in a cell with a fresh electrolyte solution for cyclic voltammetry measurements.

Figure 10:
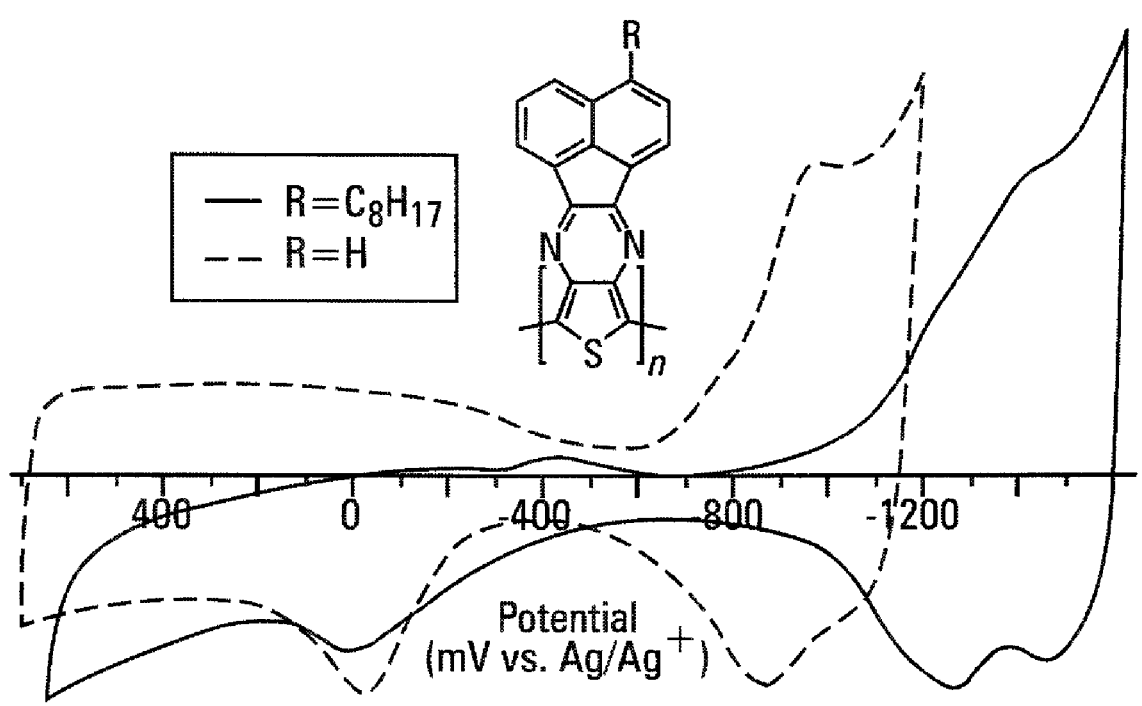
FIG. 10 shows cyclic voltammograms for polymers 4a and 20.

The CVs of polymers 4a and 20 are shown in FIG. 10. As previously reported the unfunctionalized polymer 4a exhibits an $E_g$ of ~0.5 eV. In comparison, the addition of an alkyl group to the 5-position results in a similar $E_{pa}$, although with a lower potential onset. As can be seen in FIG. 10, however, the reduction is considerably shifted, resulting in a larger $E_g$ value.

All publications, patents, and patent documents cited herein are incorporated by reference herein, as though individually incorporated by reference. The invention has been described with reference to various specific and preferred embodiments and techniques. However, it should be under-

What is claimed is:

1. A polymer of formula (II):

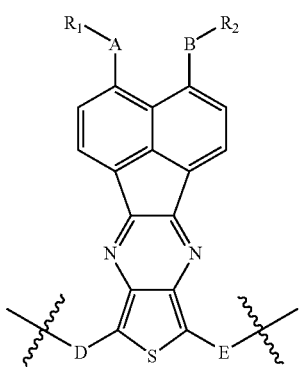

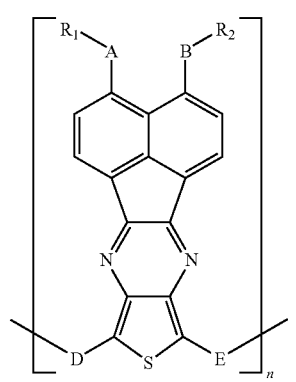

wherein:
n is 2-100;
A is a bond; and $R_1$ is H, $(C_1-C_{12})$alkyl, $(C_2-C_{12})$alkenyl, $(C_2-C_{12})$alkynyl, $(C_3-C_8)$cycloalkyl, $(C_1-C_{12})$alkanoyl, $(C_1-C_{12})$alkoxycarbonyl, cyano, halo, nitro, $R_eOSO_2-$, carboxy, trifluoromethyl, aryl, aryl$(C_1-C_{12})$alkyl, $-CH_2CH_2O(CH_2CH_2O)_mCH_3$, or $NR_aR_b$; or A is O, S, or Se and $R_1$ is H, $(C_1-C_{12})$alkyl, $(C_2-C_{12})$alkenyl, $(C_2-C_{12})$alkynyl, $(C_3-C_{12})$cycloalkyl, $(C_1-C_{12})$alkanoyl, trifluoromethyl, aryl, or aryl$(C_1-C_{12})$alkyl, or $-CH_2CH_2O(CH_2CH_2O)_mCH_3$; wherein each aryl is optionally substituted with one or more $(C_1-C_{12})$alkyl, $(C_2-C_{12})$alkenyl, $(C_2-C_{12})$alkynyl, $(C_1-C_{12})$alkoxy, $(C_3-C_8)$cycloalkyl, $(C_1-C_{12})$alkanoyl, $(C_1-C_{12})$alkanoyloxy, $(C_1-C_{12})$alkoxycarbonyl, cyano, halo, nitro, carboxy, trifluoromethyl, trifluoromethoxy, or methylenedioxy;
B is a bond; and $R_2$ is H, $(C_1-C_{12})$alkyl, $(C_2-C_{12})$alkenyl, $(C_2-C_{12})$alkynyl, $(C_3-C_8)$cycloalkyl, $(C_1-C_{12})$alkanoyl, cyano, halo, nitro, $R_eOSO_2-$, carboxy, trifluoromethyl, aryl, aryl$(C_1-C_{12})$alkyl, $-CH_2CH_2O(CH_2CH_2O)_mCH_3$, or $NR_cR_d$; or B is O, S, or Se and $R_2$ is H, $(C_1-C_{12})$alkyl, $(C_2-C_{12})$alkenyl, $(C_2-C_{12})$alkynyl, $(C_3-C_8)$cycloalkyl, $(C_1-C_{12})$alkanoyl, trifluoromethyl, aryl, or aryl$(C_1-C_{12})$alkyl, or $-CH_2CH_2O(CH_2CH_2O)_mCH_3$; wherein each aryl is optionally substituted with one or more $(C_1-C_{12})$alkyl, $(C_2-C_{12})$alkenyl, $(C_2-C_{12})$alkynyl, $(C_1-C_{12})$alkoxy, $(C_3-C_8)$cycloalkyl, $(C_1-C_{12})$alkanoyl, $(C_1-C_{12})$alkanoyloxy, $(C_1-C_{12})$alkoxycarbonyl, cyano, halo, nitro, carboxy, trifluoromethyl, trifluoromethoxy, or methylenedioxy;
$R_a$ and $R_b$ are each independently $(C_1-C_{12})$alkyl, $(C_2-C_{12})$alkenyl, $(C_2-C_{12})$alkynyl, $(C_1-C_{12})$alkoxy, $(C_3-C_8)$cycloalkyl, $(C_1-C_{12})$alkanoyl, $(C_1-C_{12})$alkanoyloxy, aryl, aryl$(C_1-C_{12})$alkyl, $-CH_2CH_2O(CH_2CH_2O)_mCH_3$, or $(C_1-C_{12})$alkoxycarbonyl; or $R_a$ and $R_b$ together with the nitrogen to which they are attached form a morpholino, thiomorpholino or pyrrolidino ring;
$R_c$ and $R_d$ are each independently $(C_1-C_{12})$alkyl, $(C_2-C_{12})$alkenyl, $(C_2-C_{12})$alkynyl, $(C_1-C_{12})$alkoxy, $(C_3-C_8)$cycloalkyl, $(C_1-C_{12})$alkanoyl, $(C_1-C_{12})$alkanoyloxy, aryl, aryl$(C_1-C_{12})$alkyl, $-CH_2CH_2O(CH_2CH_2O)_mCH_3$, or $(C_1-C_{12})$alkoxycarbonyl; or $R_c$ and $R_d$ together with the nitrogen to which they are attached form a morpholino, thiomorpholino or pyrrolidino ring;
$R_e$ is H or $(C_1-C_{12})$alkyl;
m is 0-5;
D is absent or is phenyl, thienyl, bithienyl, terthienyl, quaterthienyl, or fluorenyl, which phenyl, thienyl, bithienyl, terthienyl, quaterthienyl, and fluorenyl is optionally substituted with one or more $(C_1-C_{12})$alkyl, $(C_2-C_{12})$alkenyl, $(C_2-C_{12})$alkynyl, $(C_1-C_{12})$alkoxy, $(C_3-C_8)$cycloalkyl, $(C_1-C_{12})$alkanoyl, $(C_1-C_{12})$alkanoyloxy, $(C_1-C_{12})$alkoxycarbonyl, cyano, halo, nitro, carboxy, trifluoromethyl, trifluoromethoxy, or methylenedioxy; and
E is absent or is phenyl, thienyl, bithienyl, terthienyl, quaterthienyl, or fluorenyl, which phenyl, thienyl, bithienyl, terthienyl, quaterthienyl, and fluorenyl is optionally substituted with one or more $(C_1-C_{12})$alkyl, $(C_2-C_{12})$alkenyl, $(C_2-C_{12})$alkynyl, $(C_1-C_{12})$alkoxy, $(C_3-C_8)$cycloalkyl, $(C_1-C_{12})$alkanoyl, $(C_1-C_{12})$alkanoyloxy, $(C_1-C_{12})$alkoxycarbonyl, cyano, halo, nitro, carboxy, trifluoromethyl, trifluoromethoxy, or methylenedioxy;
or a salt thereof.

2. The polymer of claim 1 wherein A is a bond.
3. The polymer of claim 1 wherein B is a bond.
4. The polymer of claim 1 wherein D is absent.
5. The polymer of claim 1 wherein D is thienyl.
6. The polymer of claim 1 wherein E is absent.
7. The polymer of claim 1 wherein E is thienyl.
8. The polymer of claim 1 wherein n is 20-30.
9. The polymer of claim 1 wherein A is a bond; and $R_1$ is H, $(C_1-C_{12})$alkyl, cyano, fluoro, chloro, bromo, or $NH_2$.
10. The polymer of claim 1 wherein B is a bond; and $R_2$ is H, $(C_1-C_{12})$alkyl, cyano, fluoro, chloro, bromo, or $NH_2$.
11. The polymer of claim 1 which is a polymer of formula (III):

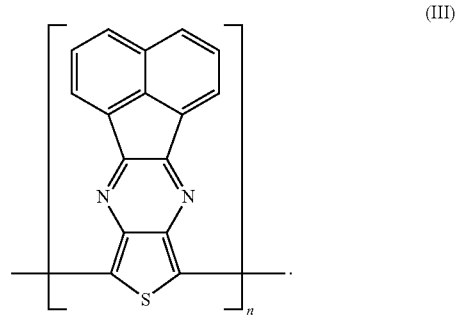

12. The polymer of claim 1 which is a polymer of formula (V):

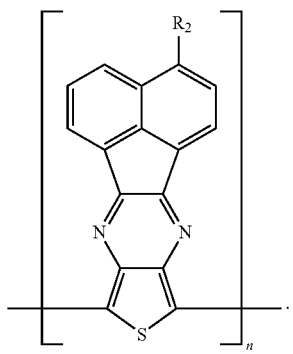

13. The polymer of claim 11 wherein n is 20-30.
14. The polymer of claim 12 wherein n is 20-30.
15. An apparatus comprising: a polymer as described in claim 1 including a source contact coupled to the polymer, a drain contact coupled to the polymer, and a gate contact coupled to the polymer through an insulative layer.
16. An apparatus comprising:
an electronic circuit; and
a switch including a polymer as described in claim 1 coupled to the electronic circuit.
17. A method comprising:
forming a thin film including a polymer as described in claim 1 on a substrate; and
forming an active electronic device in the polymer.
18. An apparatus comprising:
a substrate; and
an electronic device included in the substrate, wherein the electronic device includes a polymer as described in claim 1.
19. The apparatus of claim 18, wherein the substrate includes a semiconductor.
20. The apparatus of claim 19, wherein the semiconductor includes silicon.
21. The apparatus of claim 18, wherein the electronic device includes a transistor.
22. The apparatus of claim 21, wherein the transistor includes a field-effect transistor.
23. The apparatus of claim 18, wherein the electronic device includes a photovoltaic device.
24. The apparatus of claim 18, wherein the electronic device includes a sensor.
25. The apparatus of claim 24, wherein the sensor includes a strain sensor.
26. A method for preparing a polymer as described in claim 1, wherein D and E are each absent, comprising polymerizing a corresponding compound of formula (IV):

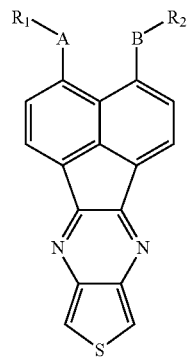

to provide the polymer.
27. The method of claim 26 wherein the compound of formula (IV) is polymerized by electropolymerization, oxidative chemical polymerization, or transition metal mediated polymerization.

* * * * *

UNITED STATES PATENT AND TRADEMARK OFFICE
CERTIFICATE OF CORRECTION

PATENT NO. : 7,888,452 B2  
APPLICATION NO. : 12/197848  
DATED : February 15, 2011  
INVENTOR(S) : Seth C. Rasmussen and Jon P. Nietfeld It is certified that error appears in the above-identified patent and that said Letters Patent is hereby corrected as shown below:

Column 2, lines 38-39, replace "$CH_2CH_2O(CH_2CH_2O)_m\ CH_3$," with:
   -$CH_2CH_2O(CH_2CH_2O)_mCH_3$, Column 29, lines 60-61, replace "-$CH_2CH_2O(CH_2CH_2O)_m\ CH_3$," with:
   -$CH_2CH_2O(CH_2CH_2O)_mCH_3$, Column 29, line 64, replace "-$CH_2CH_2O(CH_2CH_2O)_m\ CH_3$;" with:
   -$CH_2CH_2O(CH_2CH_2O)_mCH_3$;

Signed and Sealed this  
Thirty-first Day of January, 2012

David J. Kappos  
*Director of the United States Patent and Trademark Office*